United States Patent
Lui

(10) Patent No.: US 11,031,390 B2
(45) Date of Patent: Jun. 8, 2021

(54) BIDIRECTIONAL SWITCH HAVING BACK TO BACK FIELD EFFECT TRANSISTORS

(71) Applicant: Alpha and Omega Semiconductor Incorporated, Sunnyvale, CA (US)

(72) Inventor: Sik Lui, Sunnyvale, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 16/560,825

(22) Filed: Sep. 4, 2019

(65) Prior Publication Data

US 2019/0393218 A1 Dec. 26, 2019

Related U.S. Application Data

(62) Division of application No. 15/199,828, filed on Jun. 30, 2016, now Pat. No. 10,446,545.

(51) Int. Cl.
*H01L 29/78* (2006.01)
*H01L 29/08* (2006.01)
(Continued)

(52) U.S. Cl.
CPC .... *H01L 27/088* (2013.01); *H01L 21/823425* (2013.01); *H01L 21/823487* (2013.01);
(Continued)

(58) Field of Classification Search
CPC .............. H01L 27/088; H01L 27/0688; H01L 27/0727; H01L 27/0629; H01L 2029/7857; H01L 21/823425; H01L 21/823487; H01L 29/0847; H01L 29/4236; H01L 29/7827; H01L 29/7828; H01L 29/78642; H01L 29/78648; H01L 29/7404; H01L 29/7889; H01L 29/7926; H01L 2225/06555; H01L 2225/06558; H01L 2924/13018; H01L 2924/13085; H01L 2924/13087; H01L 29/42352; H01L 29/66; H01L 29/66431; H01L 29/66462; H01L 29/66613–66628;
(Continued)

(56) References Cited

U.S. PATENT DOCUMENTS 4,890,144 A 12/1989 Teng et al.
7,122,882 B2 10/2006 Lui et al.
(Continued)

OTHER PUBLICATIONS

Final Office Action for U.S. Appl. No. 15/199,828, dated Mar. 18, 2019.
(Continued)

*Primary Examiner* — Natalia A Gondarenko
(74) *Attorney, Agent, or Firm* — JDI Patent; Joshua D. Isenberg; Robert Pullman

(57) ABSTRACT

A bi-directional semiconductor switching device is formed by forming first and second vertical field effect transistors (FETs) formed in tandem from a semiconductor substrate. A source for the first FET is on a first side of the substrate and a source for the second FET is on a second side of the substrate opposite the first side. Gates for both the first and second. FETs are disposed in tandem in a common set of trenches formed a drift region of the semiconductor substrate that is sandwiched between the sources for the first and second FETs. The drift layer acts as a common drain for both the first FET and second FET.

9 Claims, 23 Drawing Sheets

(51) Int. Cl.
*H01L 29/74* (2006.01)
*H01L 27/06* (2006.01)
*H01L 27/07* (2006.01)
*H01L 27/088* (2006.01)
*H01L 21/8234* (2006.01)
*H01L 29/423* (2006.01)

(52) U.S. Cl.
CPC ...... *H01L 27/0629* (2013.01); *H01L 27/0688* (2013.01); *H01L 29/0847* (2013.01); *H01L 29/4236* (2013.01); *H01L 29/7404* (2013.01); *H01L 29/7828* (2013.01); *H01L 27/0727* (2013.01)

(58) Field of Classification Search
CPC ............. H01L 29/66909; H01L 29/407; H01L 29/732; H01L 29/747; H01L 29/749; H01L 29/7787; H01L 29/7855; H01L 29/78645; H01L 29/7813; H01L 29/8083; H01L 29/8124; H01L 2924/1306; H01L 2924/13033; H01L 2924/13062; H01L 2924/13063; H01L 2924/13066; H01L 2924/13071; H01L 2924/13078; H01L 2924/13081; H01L 2924/13091; H01L 2924/13092; H01L 29/086; H01L 29/0865–29/0869; H01L 29/0878; H01L 29/0882–0886; H01L 29/41758; H01L 29/78618–29/78627; H01L 29/8128; H01L 27/1158; H01L 27/11553; H01L 21/823412; H01L 21/823807; H01L 21/823456; H01L 21/823468; H01L 21/82385; H01L 21/823864; H01L 2029/7858; H01L 2029/7863; H01L 27/0825; H01L 27/0826; H01L 27/0828; H01L 27/0883; H01L 27/10841; H01L 27/10864
USPC .......................... 257/334, 330, 331, 328, 262
See application file for complete search history.

(56) References Cited

U.S. PATENT DOCUMENTS

| | | |
|---|---|---|
| 7,183,616 B2 | 2/2007 | Bhalla et al. |
| 7,208,818 B2 | 4/2007 | Luo et al. |
| 7,221,195 B2 | 5/2007 | Bhalla et al. |
| 7,285,822 B2 | 10/2007 | Bhalla et al. |
| 7,335,946 B1 | 2/2008 | Bhalla et al. |
| 7,355,433 B2 | 4/2008 | Lui et al. |
| 7,378,884 B2 | 5/2008 | Bhalla et al. |
| 7,391,100 B2 | 6/2008 | Luo et al. |
| 7,436,022 B2 | 10/2008 | Bhalla et al. |
| 7,443,225 B2 | 10/2008 | Lui et al. |
| 7,453,119 B2 | 11/2008 | Bhalla et al. |
| 7,535,021 B2 | 5/2009 | Bhalla et al. |
| 7,605,425 B2 | 10/2009 | Bhalla et al. |
| 7,633,119 B2 | 12/2009 | Bhalla et al. |
| 7,633,140 B2 | 12/2009 | Luo et al. |
| 7,659,570 B2 | 2/2010 | Bhalla et al. |
| 7,671,662 B2 | 3/2010 | Lui et al. |
| 7,745,878 B2 | 6/2010 | Bhalla et al. |
| 7,755,379 B2 | 7/2010 | Lui et al. |
| 7,764,105 B2 | 7/2010 | Bhalla et al. |
| 7,786,531 B2 | 8/2010 | Lui et al. |
| 7,800,169 B2 | 9/2010 | Bhalla et al. |
| 7,863,675 B2 | 1/2011 | Bhalla et al. |
| 7,868,381 B1 | 1/2011 | Bhalla et al. |
| 7,923,774 B2 | 4/2011 | Bhalla et al. |
| 7,936,011 B2 | 5/2011 | Bhalla et al. |
| 7,960,233 B2 | 6/2011 | Lui et al. |
| 8,008,716 B2 | 8/2011 | Lui et al. |
| 8,035,159 B2 | 10/2011 | Bhalla et al. |
| 8,067,822 B2 | 11/2011 | Luo et al. |
| 8,119,482 B2 | 2/2012 | Bhalla et al. |
| 8,163,618 B2 | 4/2012 | Bhalla et al. |
| 8,169,062 B2 | 5/2012 | Luo et al. |
| 8,174,283 B2 | 5/2012 | Bhalla et al. |
| 8,288,229 B2 | 10/2012 | Bhalla et al. |
| 8,324,683 B2 | 12/2012 | Lui et al. |
| 8,357,973 B2 | 1/2013 | Lui et al. |
| 8,367,501 B2 | 2/2013 | Lui et al. |
| 8,372,708 B2 | 2/2013 | Bhalla et al. |
| 8,394,702 B2 | 3/2013 | Tai et al. |
| 8,431,470 B2 | 4/2013 | Lui et al. |
| 8,431,989 B2 | 4/2013 | Bhalla et al. |
| 8,445,370 B2 | 5/2013 | Lui et al. |
| 8,580,667 B2 | 11/2013 | Lui et al. |
| 8,597,998 B2 | 12/2013 | Bhalla et al. |
| 8,637,926 B2 | 1/2014 | Lui et al. |
| 8,643,135 B2 | 2/2014 | Bobde et al. |
| 8,669,613 B2 | 3/2014 | Lui et al. |
| 8,753,935 B1 | 6/2014 | Bobde et al. |
| 8,759,908 B2 | 6/2014 | Lui et al. |
| 8,809,948 B1 | 8/2014 | Yilmaz et al. |
| 8,828,857 B2 | 9/2014 | Lui et al. |
| 8,829,603 B2 | 9/2014 | Lui et al. |
| 8,896,131 B2 | 11/2014 | Bhalla et al. |
| 8,907,416 B2 | 12/2014 | Tai et al. |
| 8,933,506 B2 | 1/2015 | Bobde et al. |
| 8,946,816 B2 | 2/2015 | Bobde et al. |
| 8,946,942 B2 | 2/2015 | Lui et al. |
| 8,951,867 B2 | 2/2015 | Lee et al. |
| 8,956,940 B2 | 2/2015 | Lui et al. |
| 8,963,233 B2 | 2/2015 | Bhalla et al. |
| 8,963,240 B2 | 2/2015 | Bhalla et al. |
| 8,980,716 B2 | 3/2015 | Lui et al. |
| 9,013,848 B2 | 4/2015 | Lui |
| 9,024,378 B2 | 5/2015 | Bhalla et al. |
| 9,123,805 B2 | 9/2015 | Lui |
| 9,136,370 B2 | 9/2015 | Lui et al. |
| 9,136,380 B2 | 9/2015 | Yilmaz et al. |
| 9,171,917 B2 | 10/2015 | Bobde et al. |
| 9,190,512 B2 | 11/2015 | Lee et al. |
| 9,214,545 B2 | 12/2015 | Tai et al. |
| 9,219,003 B2 | 12/2015 | Lui et al. |
| 9,230,957 B2 | 1/2016 | Lui et al. |
| 9,246,347 B2 | 1/2016 | Lui et al. |
| 9,252,264 B2 | 2/2016 | Bobde et al. |
| 9,269,805 B2 | 2/2016 | Lui |
| 2008/0001220 A1 | 1/2008 | Bhalla et al. |
| 2008/0001646 A1 | 1/2008 | Lui et al. |
| 2008/0012050 A1 | 1/2008 | Aoki et al. |
| 2008/0067584 A1 | 3/2008 | Lui et al. |
| 2008/0173956 A1 | 7/2008 | Bhalla et al. |
| 2008/0186048 A1 | 8/2008 | Lui et al. |
| 2008/0265289 A1 | 10/2008 | Bhalla et al. |
| 2008/0296675 A1 | 12/2008 | Yanagida |
| 2008/0309382 A1 | 12/2008 | Bhalla et al. |
| 2009/0039456 A1 | 2/2009 | Bhalla et al. |
| 2009/0072301 A1 | 3/2009 | Bhalla et al. |
| 2009/0128223 A1 | 5/2009 | Lui et al. |
| 2009/0218890 A1 | 9/2009 | Lui et al. |
| 2009/0219044 A1 | 9/2009 | Bhalla et al. |
| 2009/0224316 A1 | 9/2009 | Bhalla et al. |
| 2010/0044796 A1 | 2/2010 | Hshieh |
| 2010/0090276 A1 | 4/2010 | Bhalla et al. |
| 2010/0148246 A1 | 6/2010 | Bhalla et al. |
| 2010/0258897 A1 | 10/2010 | Lui et al. |
| 2010/0330767 A1 | 12/2010 | Lui et al. |
| 2011/0042724 A1 | 2/2011 | Bhalla et al. |
| 2011/0049580 A1 | 3/2011 | Lui et al. |
| 2011/0095358 A1 | 4/2011 | Micciche' et al. |
| 2011/0097885 A1 | 4/2011 | Bhalla et al. |
| 2011/0176247 A1 | 7/2011 | Goldberger et al. |
| 2011/0204440 A1 | 8/2011 | Bhalla et al. |
| 2011/0207276 A1 | 8/2011 | Bhalla et al. |
| 2011/0221005 A1 | 9/2011 | Luo et al. |
| 2011/0233666 A1 | 9/2011 | Lui et al. |
| 2011/0233667 A1 | 9/2011 | Tai et al. |
| 2011/0285427 A1 | 11/2011 | Koyama et al. |
| 2012/0007206 A1 | 1/2012 | Bhalla et al. |

(56) References Cited

U.S. PATENT DOCUMENTS

| | | |
|---|---|---|
| 2012/0018793 A1 | 1/2012 | Bhalla et al. |
| 2012/0025301 A1 | 2/2012 | Lui et al. |
| 2012/0074896 A1 | 3/2012 | Lui et al. |
| 2012/0132988 A1 | 5/2012 | Lui et al. |
| 2012/0146090 A1 | 6/2012 | Lui et al. |
| 2012/0193676 A1 | 8/2012 | Bobde et al. |
| 2012/0199875 A1 | 8/2012 | Bhalla et al. |
| 2012/0248530 A1 | 10/2012 | Lui et al. |
| 2012/0299091 A1 | 11/2012 | Tsai et al. |
| 2012/0299092 A1 | 11/2012 | Zundel et al. |
| 2012/0306044 A1 | 12/2012 | Bobde et al. |
| 2012/0329225 A1 | 12/2012 | Bhalla et al. |
| 2013/0043527 A1 | 2/2013 | Lui et al. |
| 2013/0093001 A1 | 4/2013 | Bhalla et al. |
| 2013/0105886 A1 | 5/2013 | Lui et al. |
| 2013/0126966 A1 | 5/2013 | Lui et al. |
| 2013/0175612 A1 | 7/2013 | Tai et al. |
| 2013/0224919 A1 | 8/2013 | Ding et al. |
| 2014/0015036 A1* | 1/2014 | Fursin ............... H01L 29/7828 257/329 |
| 2014/0048846 A1 | 2/2014 | Lui et al. |
| 2014/0054682 A1* | 2/2014 | Padmanabhan ..... H01L 29/7813 257/330 |
| 2014/0085760 A1 | 3/2014 | Lui |
| 2014/0138767 A1 | 5/2014 | Lui et al. |
| 2014/0151790 A1 | 6/2014 | Lui et al. |
| 2014/0175536 A1 | 6/2014 | Lee et al. |
| 2014/0175540 A1 | 6/2014 | Bobde et al. |
| 2014/0225187 A1 | 8/2014 | Bhalla et al. |
| 2014/0239382 A1 | 8/2014 | Bobde et al. |
| 2014/0252494 A1 | 9/2014 | Lui et al. |
| 2014/0264571 A1 | 9/2014 | Lui et al. |
| 2014/0319606 A1 | 10/2014 | Bhalla et al. |
| 2014/0332882 A1 | 11/2014 | Lui et al. |
| 2014/0339630 A1 | 11/2014 | Yilmaz et al. |
| 2015/0060936 A1 | 3/2015 | Ding et al. |
| 2015/0097232 A1 | 4/2015 | Tai et al. |
| 2015/0129956 A1 | 5/2015 | Lui |
| 2015/0137225 A1 | 5/2015 | Lui et al. |
| 2015/0137227 A1 | 5/2015 | Bobde et al. |
| 2015/0145037 A1 | 5/2015 | Lee et al. |
| 2015/0162777 A1 | 6/2015 | Lui et al. |
| 2015/0171201 A1 | 6/2015 | Lui et al. |
| 2015/0206943 A1 | 7/2015 | Bobde et al. |
| 2015/0295495 A1 | 10/2015 | Lui et al. |
| 2015/0311295 A1 | 10/2015 | Lee et al. |
| 2015/0372133 A1 | 12/2015 | Lui |
| 2015/0380544 A1 | 12/2015 | Yilmaz et al. |
| 2016/0064551 A1 | 3/2016 | Lee et al. |
| 2016/0099308 A1 | 4/2016 | Lui et al. |
| 2016/0118380 A1 | 4/2016 | Lui et al. |
| 2016/0141411 A1 | 5/2016 | Bobde et al. |
| 2016/0172482 A1 | 6/2016 | Bobde et al. |
| 2016/0181391 A1 | 6/2016 | Bobde et al. |
| 2016/0181409 A1 | 6/2016 | Alexander et al. |
| 2016/0191048 A1 | 6/2016 | Lui et al. |
| 2017/0141223 A1 | 5/2017 | Hoshi |

OTHER PUBLICATIONS

Final Office Action for U.S. Appl. No. 15/199,828, dated May 7, 2018.

Non-Final Office Action for U.S. Appl. No. 15/199,828, dated Oct. 16, 2018.

Notice of Allowance for U.S. Appl. No. 15/199,828, dated Jun. 7, 2019.

* cited by examiner

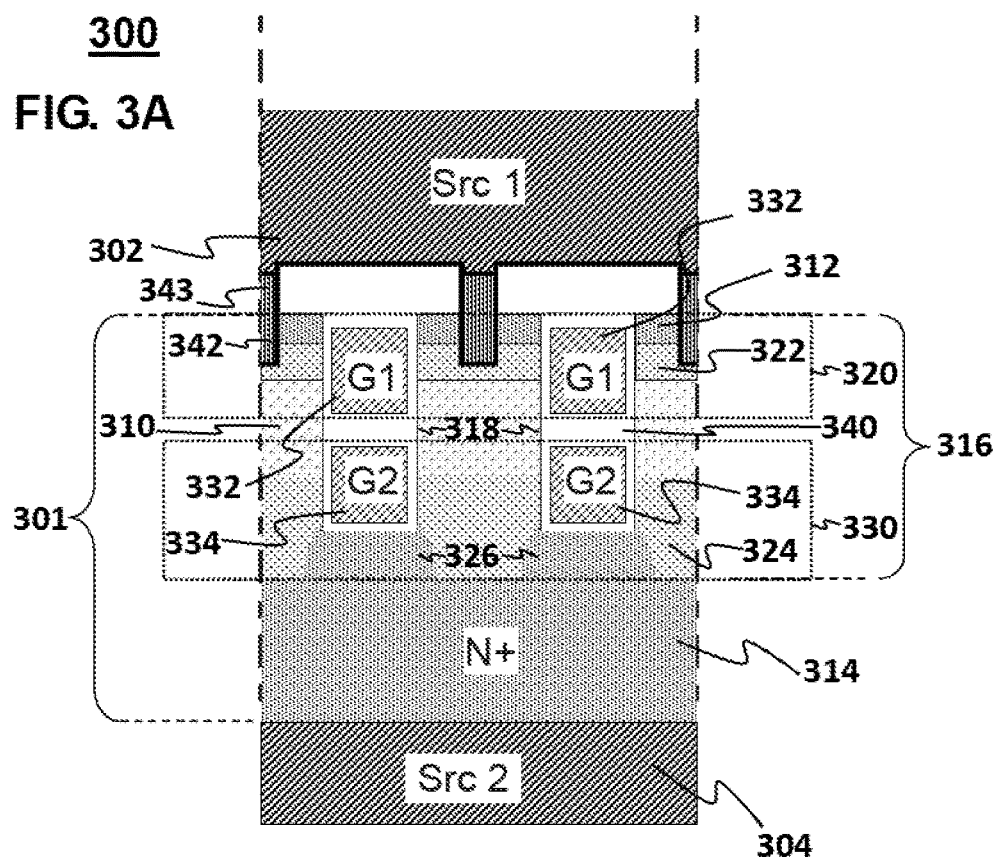
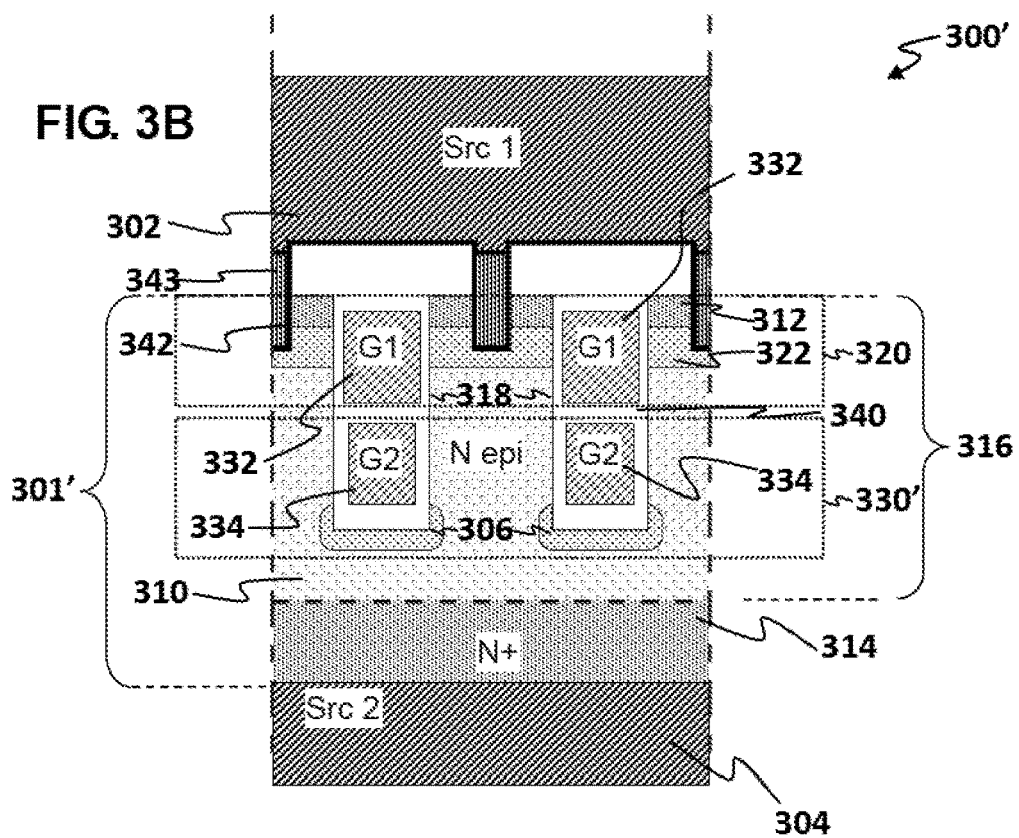

Initial oxidation

Trench mask, oxide etch

Trench etch

Bottom source1 mask, source implant

Oxide deposition, densification, CMP

Nitride deposition

HDP oxide deposition, anneal, CMP

Cover mask 1, oxide etch

Liner oxide formation

US 11,031,390 B2

BIDIRECTIONAL SWITCH HAVING BACK TO BACK FIELD EFFECT TRANSISTORS

CLAIM OF PRIORITY

This application is a division of U.S. patent application Ser. No. 15/199,828 filed Jun. 30, 2019, the entire contents of which are incorporated herein by reference.

FIELD OF THE DISCLOSURE

This disclosure relates to integrated circuits and more specifically to integrated circuit devices having back-to-back field effect transistors (FETs).

BACKGROUND OF INVENTION

Field Effect Transistors (FETs) are semiconductor transistor devices in which a voltage applied to an electrically insulated gate controls flow of current between source and drain. One example of a FET is a metal oxide semiconductor FET (MOSFET), in which a gate electrode is isolated from a semiconducting body region by an oxide insulator. When a voltage is applied to the gate, the resulting electric field generated penetrates through the oxide and creates an "inversion layer" or "channel" at the semiconductor-insulator interface. The inversion layer provides a channel through which current can pass. Varying the gate voltage modulates the conductivity of this layer and thereby controls the current flow between drain and source.

Another type of FET is known as an Accumulation Mode FET (ACCUFET). In the ACCUFET a thin channel region (accumulation-layer) in the semiconductor near the gate accumulates when it is in the ON mode. In the OFF mode, the channel is depleted by the work function between the gate and the semiconductor. In order to ensure proper turn off, the thickness, length, and doping concentration of the accumulation-layer are chosen so that it is completely depleted by the work function of the gate. This causes a potential barrier between the source and drift regions resulting in a normally-off device with the entire drain voltage supported by the drift region. Thus an ACCUFET can block high forward voltages at zero gate bias with low leakage currents. For an N-type ACCUFET for which the drift region is N-type, when a positive gate bias is applied, an accumulation channel of electrons at the insulator-semiconductor interface is created and hence a low resistance path for the electron current flow from the source to the drain is achieved.

FETs are useful in many power switching applications. In one particular configuration useful in a battery protection circuit module (PCM) two FETs are arranged in a back-to-back configuration with their drains connected together in a floating configuration. FIG. 1A schematically illustrates such a configuration. FIG. 1B shows use of such a device 100 in conjunction with a Battery Protection Circuit Module PCM 102, battery 104, and a load or charger 106. In this example, the gates of the charge and discharge FETs 120 and 130, respectively, are driven independently by a controller integrated circuit (IC) 110. This configuration allows for current control in both directions: charger to battery and battery to load. In normal charge and discharge operation both MOSFETs 120 and 130 are ON (i.e., conducting). During an overcharge charge or over-current condition of the battery 104, the controller IC 110 turns the charge FET 120 off and the discharge FET 130 on. During an overdischarge or discharge over-current condition, the controller IC 110 turns the charge FET 120 on and the discharge FET 130 off.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which:

FIG. 3A is a cross-sectional schematic diagram of a switching device having back-to-back MOSFETs formed in tandem on a common substrate at different depths according to an aspect of the present disclosure.

FIG. 3B is a cross-sectional schematic diagram of a switching device having a MOSFET and an ACCUFET formed back-to-back MOSFETs in tandem on a common substrate at different depths according to an aspect of the present disclosure.

FIGS. 4AA-4AA' are cross-sectional schematic diagrams illustrating variations on the switching device shown in FIG. 3A according to an aspect of the present disclosure.

DESCRIPTION OF THE SPECIFIC EMBODIMENTS

Introduction

Figure 2A:
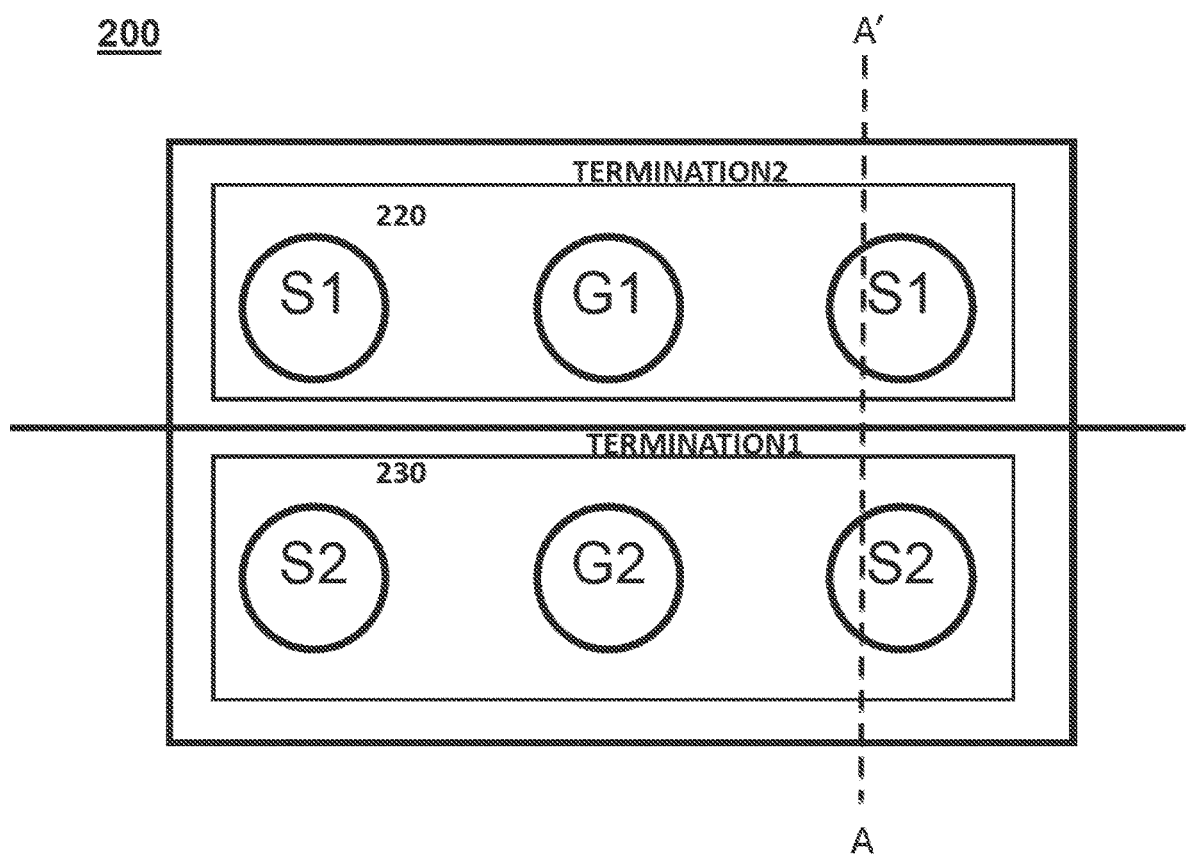
FIG. 2A is a plan view schematic diagram of a conventional switching device having two back-to-back MOSFETs in a side-by-side configuration.

FIG. 2A shows a conventional layout for a device 200 having two fully isolated vertical MOSFETs, 220 and 230, respectively, with a separate termination and channel stop for each of them. A relatively large amount of dead space is required between MOSFET 1 and MOSFET 2 to provide separate termination regions and channel stops.

Figure 2B:
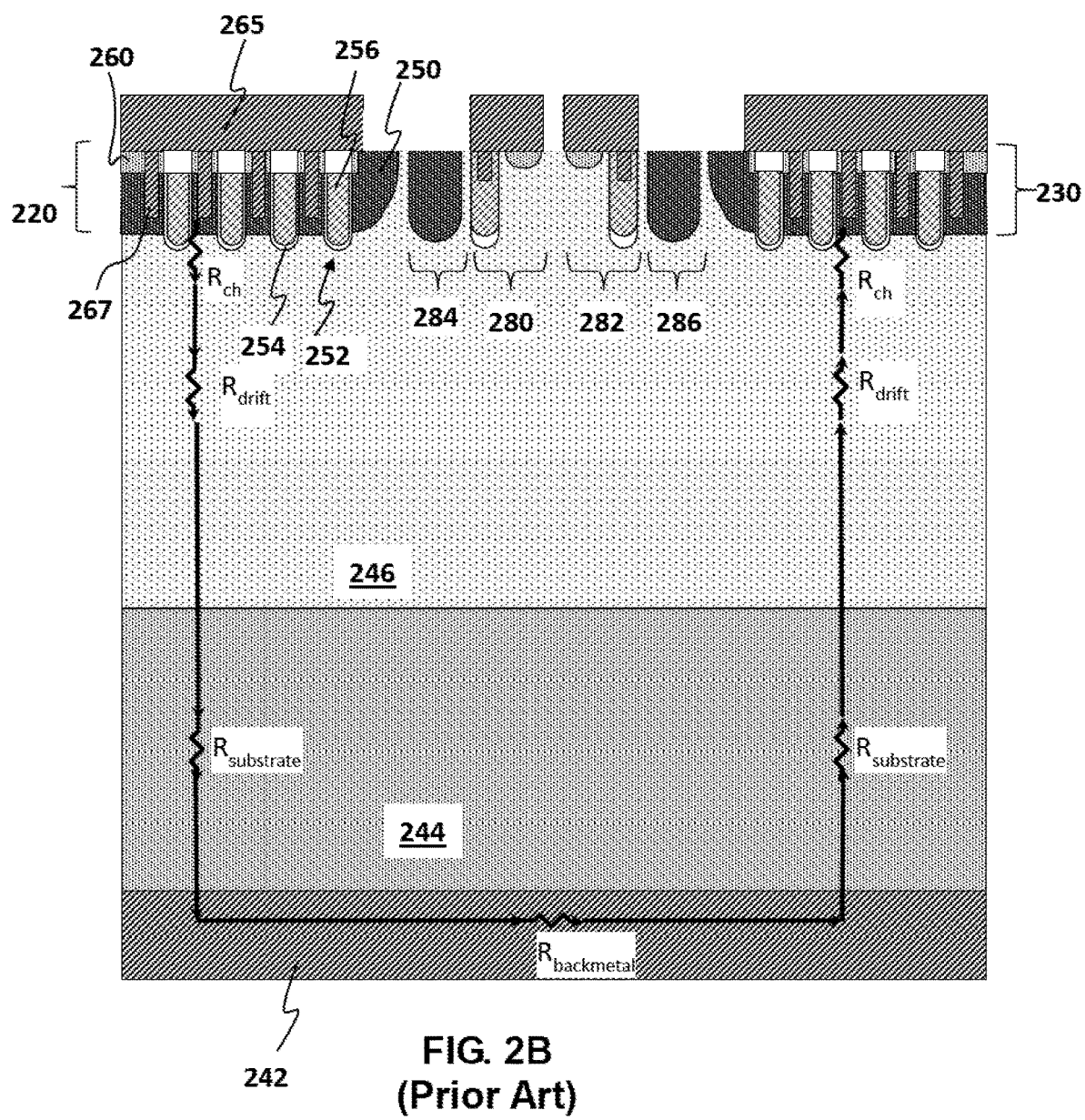
FIG. 2B is a cross-sectional schematic diagram of the conventional switching circuit of FIG. 2A taken along line A-A' of FIG. 2A.

A cross-sectional view of the device 200 of FIG. 2A is shown in FIG. 2B. Each vertical MOSFET 220/230 includes a plurality of active device cells formed in a lightly-doped epitaxial layer 246 gown on a more heavily doped substrate 244. In this example, a heavily doped (e.g., N+) substrate 244 acts as a drain and the drains of the two MOSFETs 220 and 230 are electrically connected via back metal 242 formed on a backside of the substrate 244. Active devices are formed in a lesser doped epitaxial drift layer 246 of the same conductivity type (e.g., N-type) grown on the front side of the substrate 244. Body regions 250 of opposite conductivity to the substrate 244 and epitaxial region 246

(e.g., P-type) are formed in portions of the epitaxial layer 246. Trenches 252 are formed in the epitaxial layer 246 and then lined with an insulator 254 (e.g., an oxide). Electrically isolated gate electrodes 256. e.g., made of polycrystalline silicon (polysilicon also known as poly) are disposed in the trenches 252. Heavily doped (e.g., N+) source regions 260 of the same conductivity type as the substrate 244 are formed proximate the trenches 252. External electrical contact to the source regions is made via a source metal layer 265 and vertical source contacts 267. The channel stops 280, 282 are formed using insulated electrodes similar to the gate electrodes that are shorted to the epitaxial drift region by source-type conductivity regions in the epitaxial region. The termination also includes guard rings 284, 286 formed by body-type conductivity regions.

A key characteristic of the device is the source-to-source resistance with both MOSFETs 220 and 230 turned on. It is desirable to make this resistance as small as possible. The total source-source resistance R is given by:

$$R_{ss}=2R_{ch}+2R_{drift}+R_{backmetal}+2R_{substrate},$$

Where $R_{ch}$ is the resistance of the conductive channel through the source 265 and body regions 250 when the gates are turned on, $R_{drift}$ is the resistance of the epitaxial layer 246, $R_{backmetal}$ is the resistance of the back metal 242, and $R_{substrate}$ is the resistance of the substrate 244. If the spacing between MOSFETs 220 and 230 is sufficiently large, e.g., 1000 microns, the current path from the source metal of one MOSFET 220 to the other 230 is mostly vertical through the channel 252, drift region 246, and substrate 244 and horizontal through the back metal 242. To reduce $R_{ss}$ it is desirable to make the substrate 244 thin and the back metal 242 thick. To reduce the thickness of the substrate 244 it is common to grind the substrate 244 as thin as possible after the fabrication of the devices on the front side. To reduce $R_{substrate}$ the substrate 244 is no more than 2 mils (about 50 microns) thick and to reduce $R_{backmetal}$ the back metal 242 is at least 8 microns thick. Because of the thinness of the substrate 244, the device 200 shown in FIG. 2A and FIG. 2B is very fragile and subject to breakage. Typically, at least 2 mils of protective tape or mold compound are typically used for mechanical strength. Even with this protection, the yield of usable devices is limited.

Another problem is that a conventional device of the type shown in FIGS. 2A-2B, uses a channel stop around each of the two MOSFETs, as shown in FIG. 2B at 280/282. The channel stops 280/282 take up additional space that is not used for active device cells. This reduces the area of the channel region, which increases $R_{ss}$.

Tandem FETs Formed on Common Substrate to Reduce $R_{ss}$

Figure 1A:
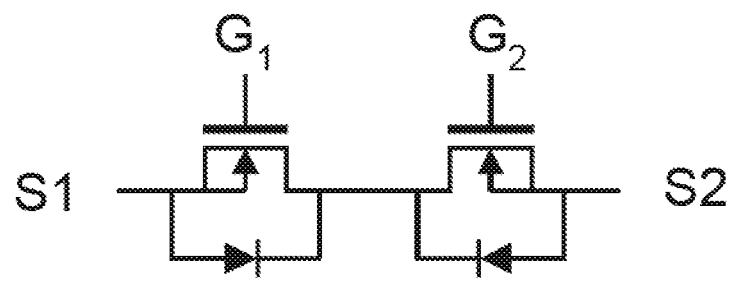
FIG. 1A is a schematic diagram of a conventional switching circuit having two back-to-back MOSFETs.
Figure 1B:
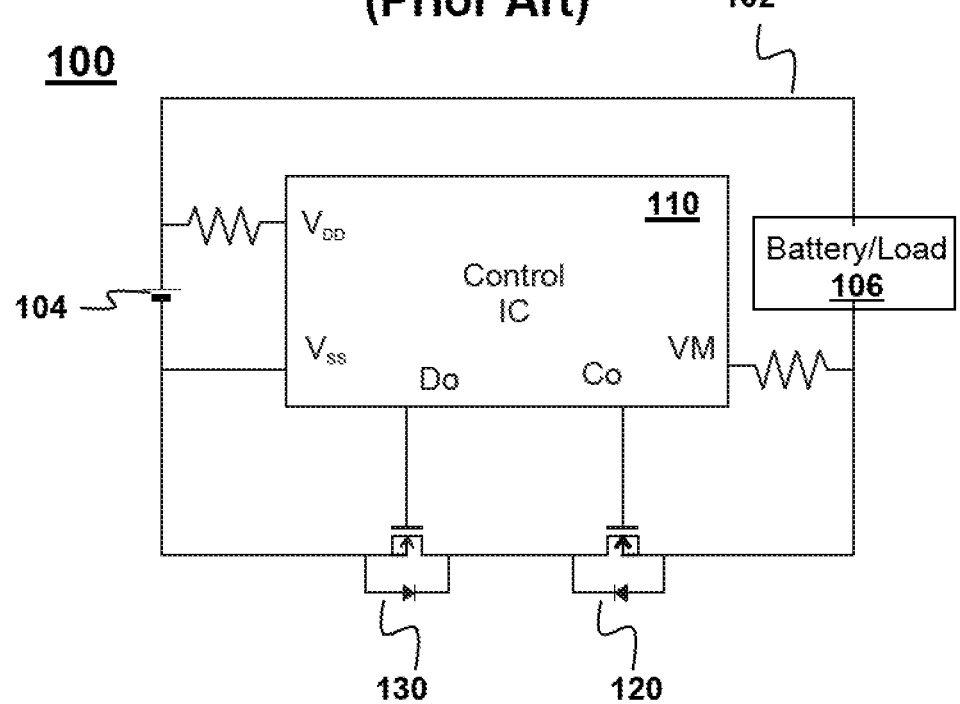
FIG. 1B is a schematic diagram of a conventional battery Protection Circuit Module (PSM).

Aspects of the present disclosure take advantage of certain characteristics of the circuit shown in FIG. 1A and FIG. 1B. For the bi-directional switch used in FIG. 1A and FIG. 1B, the drain is floating. There is no drain terminal for current to flow to or from the device through the drain. According to aspects of the present disclosure, device structures achieve compact spacing between adjacent isolated vertical FETs with their drains connected together and electrically floating by forming the FETs in tandem from a common substrate. Forming the FETs in tandem (i.e., one on top of the other) turns a relatively long lateral spacing into a relatively short vertical spacing, while at the same time greatly increasing the area of both FETs while still allowing the device to be manufactured on conventionally sized chip.

FIG. 3A illustrates an example of a switching device 300 having two back-to-back MOSFETs 320, 330 formed in tandem from a common substrate according to aspects of the present disclosure. In the illustrated example, the first and second MOSFETs 320 and 330 are formed from a common semiconducting substrate using a common set of trenches formed in the substrate with each trench containing two gate electrodes, one for each MOSFET. The gates are electrically isolated from the substrate by a gate insulator that lines the bottom and sidewalls of each trench and are electrically isolated from each other by an inter-electrode dielectric. The vertical separation between the MOSFETs 320, 330 can be made quite small so that most of the current flow is through the drift region over a much shorter vertical distance than in a conventional design like that shown in FIGS. 2A-2B. The tandem design also eliminates the need for a guard ring structure, which frees up real estate on the substrate for the MOSFETs 320, 330.

As shown in FIG. 3A a first vertical MOSFET 320 and a second vertical MOSFET 330 are formed in tandem from a common substrate 301 that includes substrate. layer 314 and an epitaxial layer 316 that is grown or otherwise formed on the substrate layer. The substrate layer 314 may be formed from a semiconductor wafer, e.g., a doped silicon wafer. The epitaxial layer includes distinct regions of different dopant types and dopant concentrations. Specifically, a second body region 324 is formed near one side of the epitaxial layer 316 and a drift region 310 is sandwiched between the first body region 322 and a second body region 324 that is formed from the epitaxial layer proximate the substrate layer 314. One or more gate trenches 318 are formed in the epitaxial layer.

In general terms, the substrate layer 314 is of a higher dopant concentration than the drift region 310, e.g. by a factor of about $10^3$ to $10^4$. The body regions 322, 324 have an opposite conductivity type to that of the substrate layer 314 and drift layer 310. By way of example, and not by way of limitation, if the substrate is N+ type, the drift layer may be N-type and the body regions P-type. In general, the substrate layer 314 may have a doping concentration of about $10^{19}/cm^3$ to about $10^{20}/cm^3$ and the drift region may have a doping concentration of about $10^{15}/cm^3$ to about $10^{17}/cm^3$. The body regions may have doping concentrations from about $10^{16}/cm^3$ to about $10^{18}/cm^3$.

Trenches 318 formed in the epitaxial layer extend from one surface thereof through the first body region 322 and the drift region 310 into the second body region 324. Sources 312 for the first FET 320 are formed on a first side of the substrate 301 proximate the gate trenches 318 with the first body region sandwiched between the sources 312 and the drift region 310, which acts as a common drain for both MOSFETS 320, 330. Sources 326 for the second FET 330 are formed proximate bottoms of the trenches 318. In general, the source regions 312, 326 have the same conductivity type and the same or similar doping concentration as the substrate layer 314. The drift region 310 is of the same conductivity type as the substrate layer 314 and source regions 312, 326 but is of lower doping concentration. The body regions 322, 324 are of opposite conductivity type to the substrate layer 314. By way of example, and not by way of limitation, the substrate 314 and source regions 312, 326 may be N+ type, the drift region 310 may be N type and the first body region 322 and second body region 324 may be P-type. In alternative implementations N type and P type may be reversed.

A first gate electrode 332 made of electrically conductive material, e.g., polysilicon, is formed in an upper portion of each trench 318 proximate the first source region 312 and first body region 322. A second gate electrode 334 made of electrically conductive material, e.g., polysilicon, is formed in a lower portion of each trench 318 proximate the second body regions 324 and second source regions 326. The gate electrodes 332, 334 are electrically isolated from the semiconducting substrate 301 and firm each other by insulating material 340, e.g., an oxide, which lines the sidewalls and bottoms of the trenches 318 and occupies space between the gate electrodes.

A first source metal layer 302 may be electrically connected to the source regions 312 via metal contacts 342 (e.g., tungsten plugs) formed in contact trenches, which may be lined with a barrier metal 343 (e.g., Titanium/Titanium Nitride) to prevent inter-diffusion of the contact metal and the semiconductor material of the substrate 301. The insulating material 340 electrically isolates the first gate electrodes 332 from the first source metal layer 302. The first source metal layer 302 provides contact between the source 312 of the first MOSFET 320 and external circuit elements. In a like manner, second source metal layer 304 may be formed on a backside of the substrate layer 314 (with or without a diffusion barrier, as appropriate) to provide electrical connection between the source 326 of the second MOSFET 330 and external circuit elements.

The first source metal layer 302 may be part of a first larger metal layer formed on a first side of the substrate 301. The first larger metal layer may include a first gate metal portion (not shown) that is electrically isolated from the first source metal layer 302 and electrically connected to the first gate electrodes 332, e.g., by vertical contacts and gate runners as is conventionally done to provide electrical connection between the gates 332 of the first MOSFET 320 and external circuit elements. The second source metal layer 304 may be similarly part of a second larger metal layer formed on a second side of the substrate 301 that is opposite the first side. The first larger metal layer may also include a second gate metal portion (not shown) that is electrically isolated from the first source metal layer 302 and the first gate metal portion and electrically connected to the second gate electrodes 334, e.g., by vertical contacts and gate runners to provide electrical connection between the gates 334 of the second MOSFET 330 and external circuit elements.

As noted above, for applications involving back to back FETs, e.g., as depicted in FIG. 1A and FIG. 1B no external connection is needed to the drift region 310 that acts as a drain for both MOSFETS 320, 330. This allows for the simple and compact design of the device 300. Furthermore, although source metal layers are shown on both sides of the device 300, aspects of the present disclosure are not limited to such implementations. In alternative implementations, connections to both sources 312, 326 may be made from the same side of the device 300. The total source to source resistance is:

$$R_{ss} = 2R_{ch} + R_{drift} + R_{substrate}$$

Since the two MOSFET share the same trench, occupying only half of the silicon area. The resulting $R_{ss}$ is less than half of the prior art.

Figure 3C:
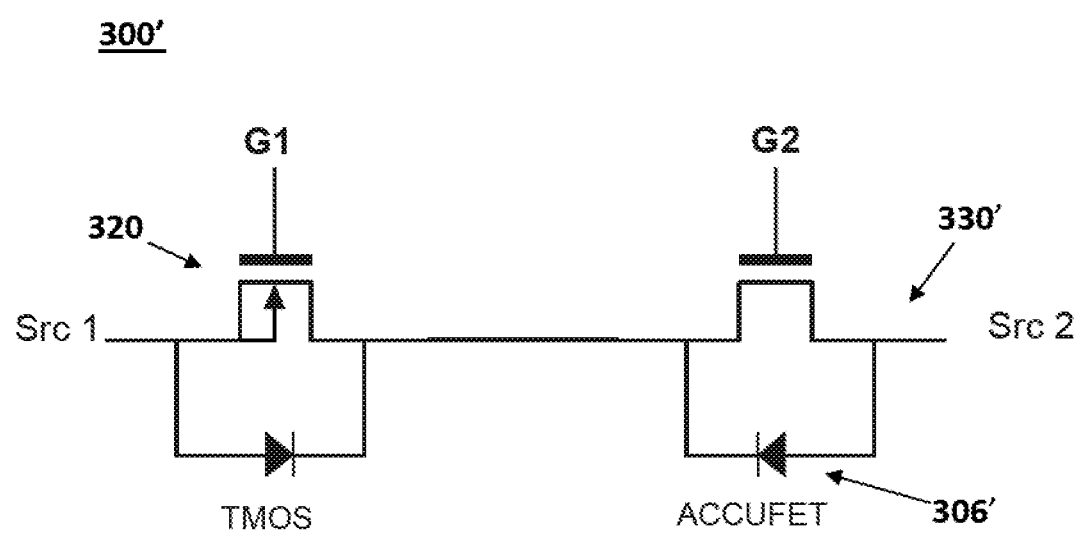
FIG. 3C is a circuit diagram corresponding to the switching device of FIG. 3B.

Aspects of the present disclosure are not limited to switching devices that use back-to-back MOSFETs. Alternative types of FET may also be used. By way of example, and not by way of limitation, FIG. 3B shows an example of an alternative switching device 300' with its corresponding circuit diagram depicted in FIG. 3C in which a first FET is a MOSFET 320 and a second FET is an ACCUFET 330' connected in parallel with a diode 306'. The device 300' can provide the same bidirectional switching function as device 300. The construction of the alternative device 300' is very similar to that of the device 300 depicted in FIG. 3A. Consequently, the same reference numerals have been used in FIG. 3B as in FIG. 3A for features common to both figures. For example, the configuration of the upper MOSFET 320 is the same in both FIG. 3A and FIG. 3B.

The device 300' is formed from a semiconductor substrate 301' that includes a substrate layer 314 (e.g., a silicon wafer) and an epitaxial layer 316 (e.g., a layer of epitaxially grown silicon) having the same doping type and lower doping concentration than that of the substrate layer. The substrate layer 314 acts as a source for the ACCUFET 330'. Doping upper portions of the epitaxial layer and 316 forms a body region 322 and source regions 312 and leaves a drift region 310 between the two transistors. Trenches 318 are formed in the epitaxial layer 316 through the source region 312 and body region 322 and into the drift region 310. First gate electrodes 332 and second gate electrodes 334 formed in upper and lower portions of the gate trenches 318, respectively are isolated from the epitaxial layer 316 and each other by insulating material 340, e.g., an oxide.

Counter-doped well regions 306 of a conductivity type opposite that of the drift region 310 and substrate layer 314 are formed in the drift region proximate the bottoms of the trenches 318. The counter-doped well regions 306 form the P-N junction with the drift region that provides the diode 306' connected in parallel with the ACCUFET similar to the body diode of upper MOSFET for reverse conduction when the ACCUFET is turned off. The well regions 306 may be electrically connected to the second source metal 304 to facilitate the electrical connection of the anode of diode 306' to the source of the ACCUFET by different options shown in FIGS. 4AA and 4AA' as further described in the process of making later.

Forming back-to-back FETs in tandem eliminates the vertical current flow through the substrate and the lateral current flow through back metal. Therefore, the back metal can be made much thinner. With the switch design of FIG. 3A and FIG. 3B the substrate 301 can be 2 to 4 mils (roughly 50 to 100 microns) thick. Thinner back metal reduces wafer process cycle time thence the wafer cost.

Figure 4A:
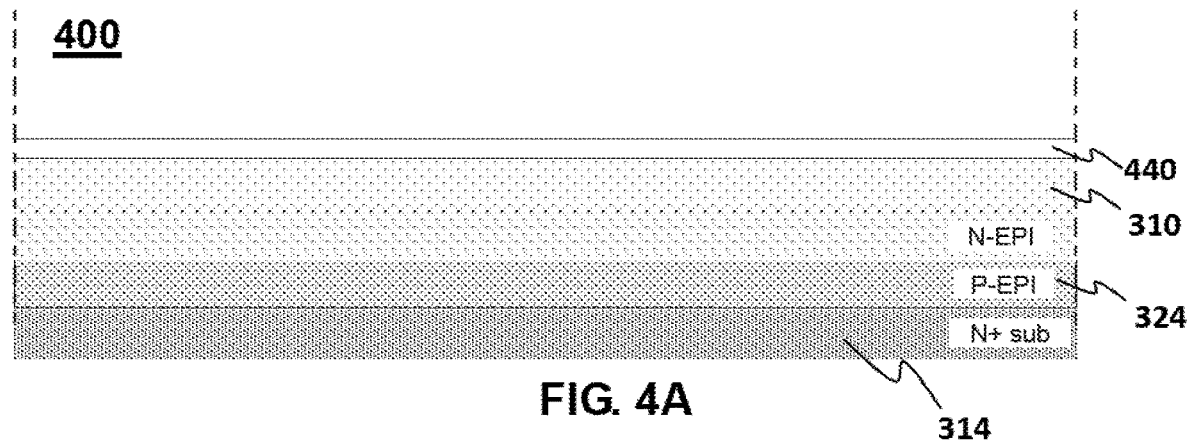
FIGS. 4A-4Z" are a sequence of cross-sectional schematic diagrams illustrating fabrication of a switching device of the type shown in FIG. 3A according to an aspect of the present disclosure.
Figure 4B:
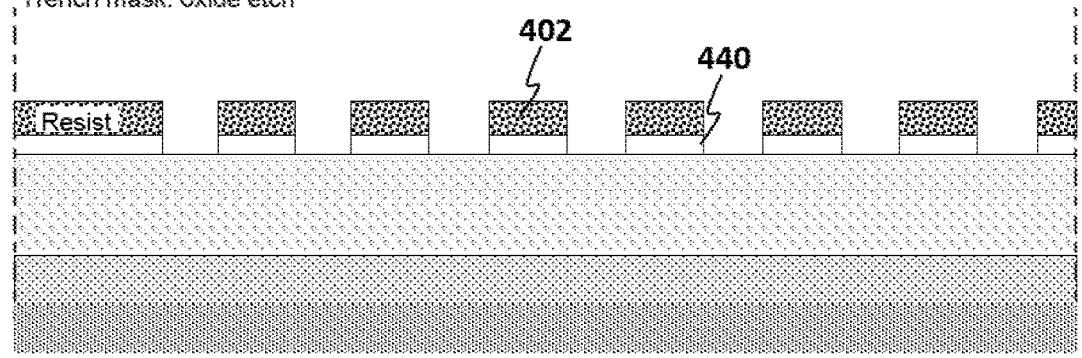
Figure 4C:
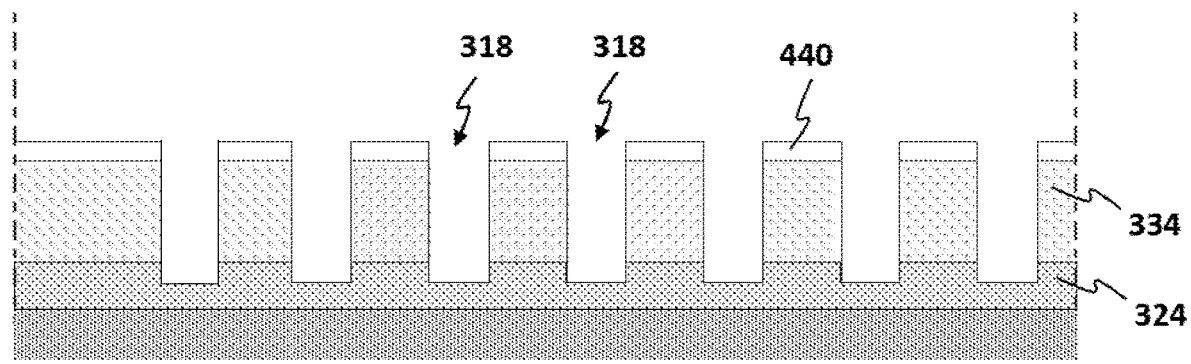
Figure 4D:
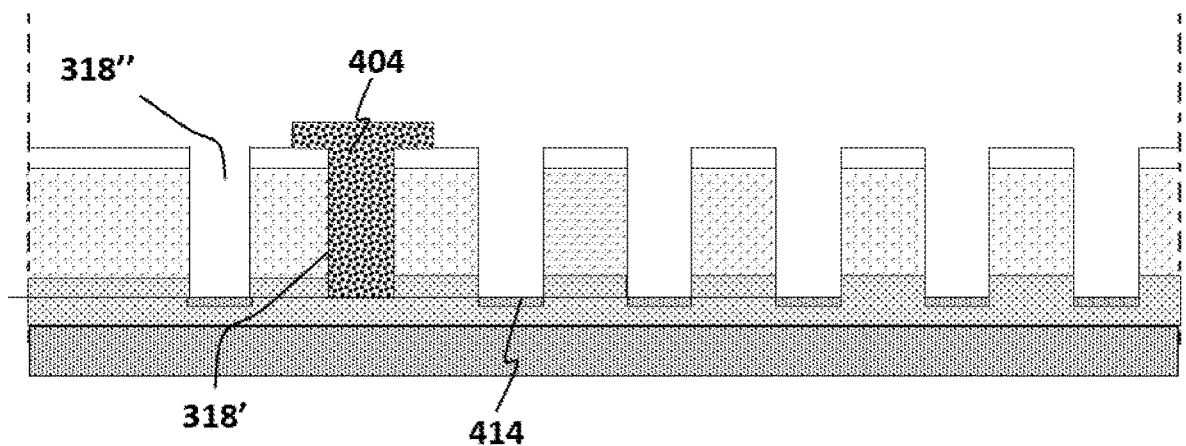
Figure 4E:
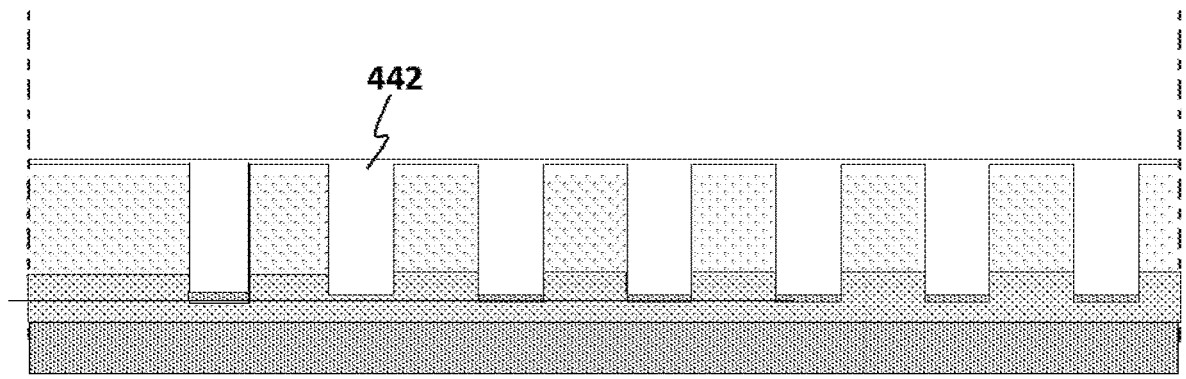
Figure 4F:
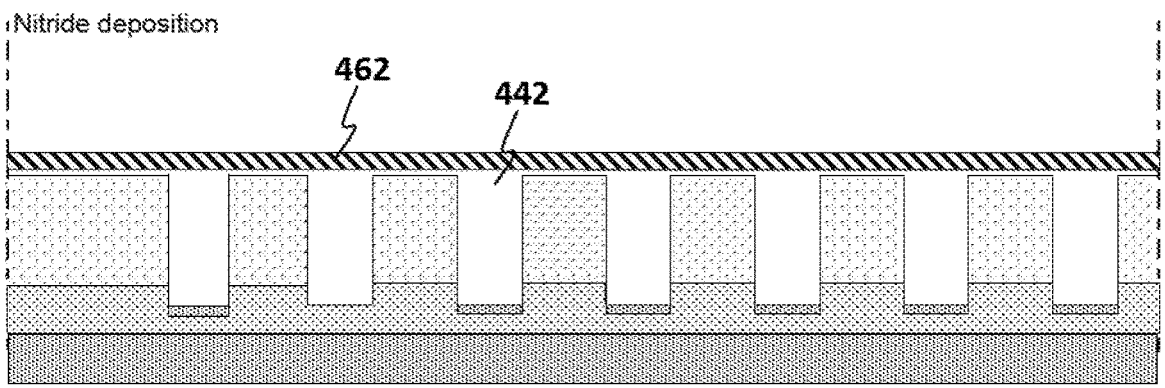
Figure 4G:
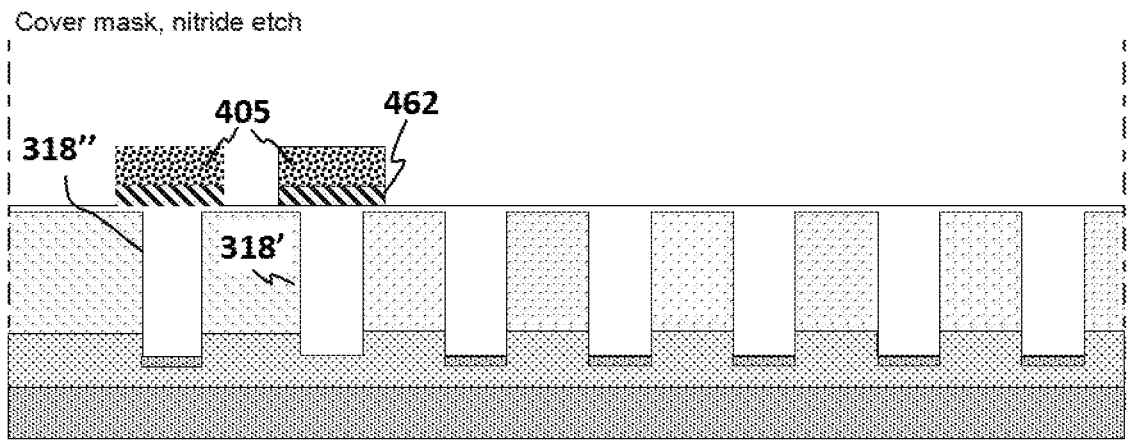
Figure 4H:
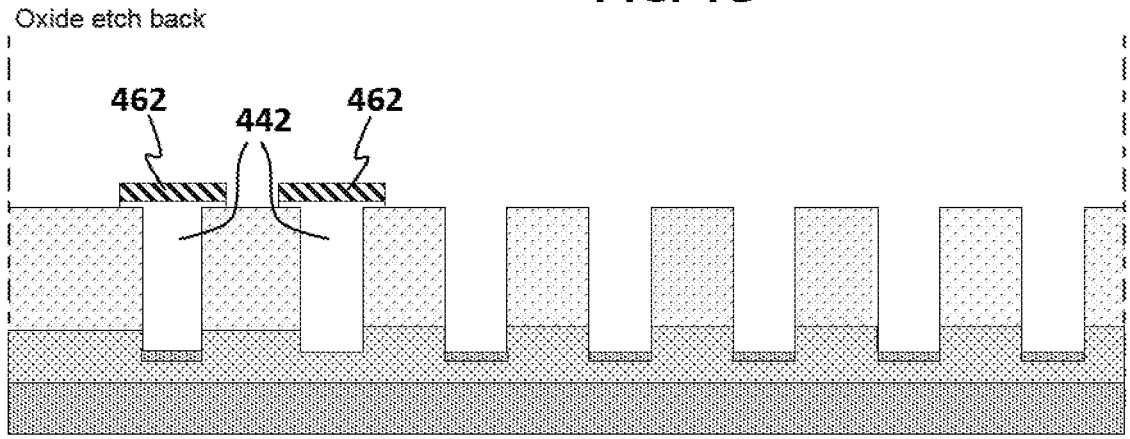
Figure 4I:
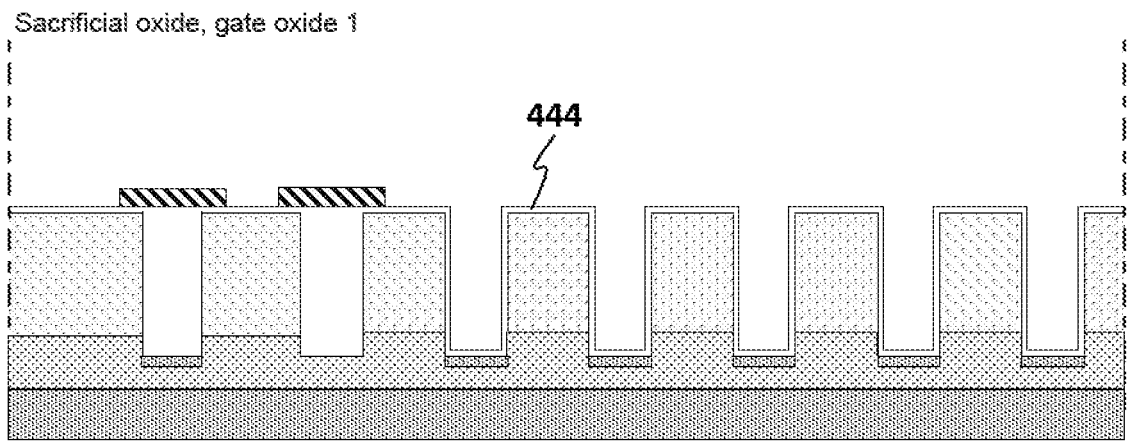
Figure 4J:
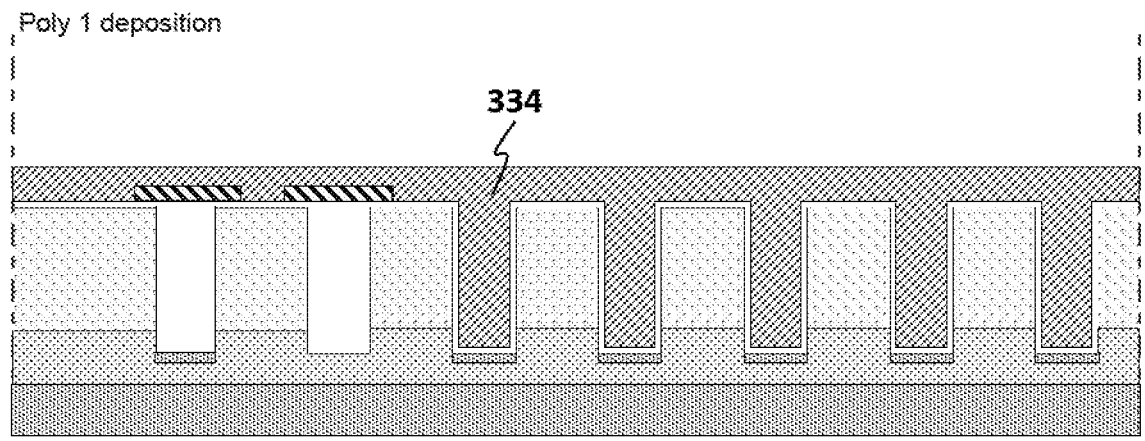
Figure 4K:
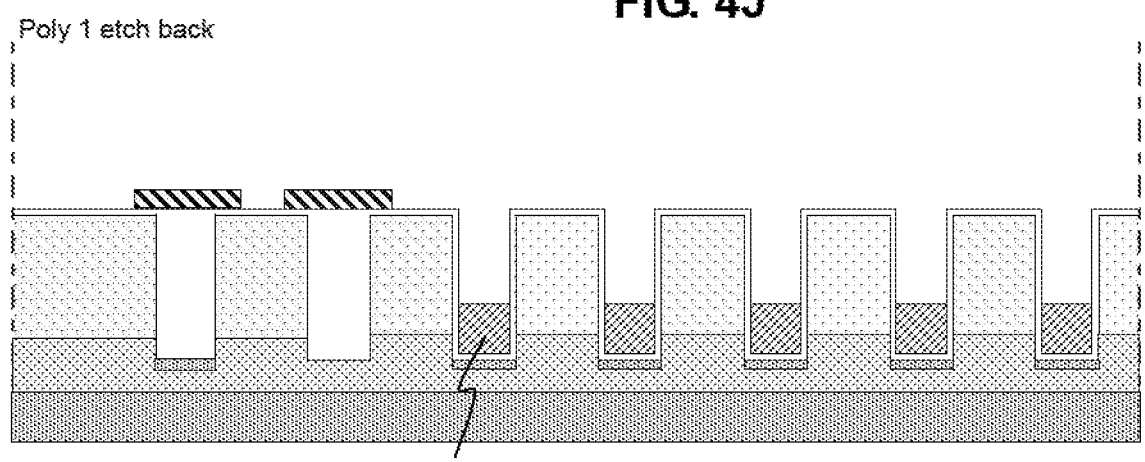
Figure 4L:
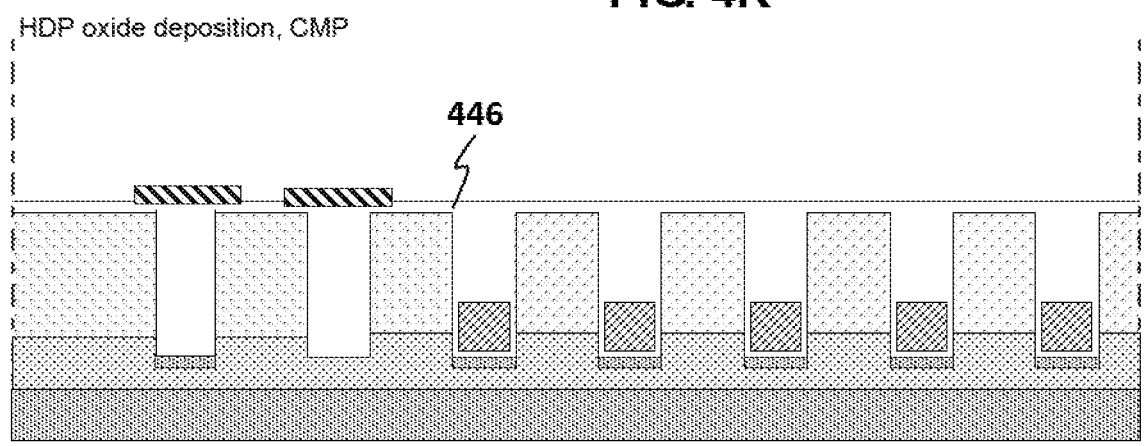
Figure 4M:
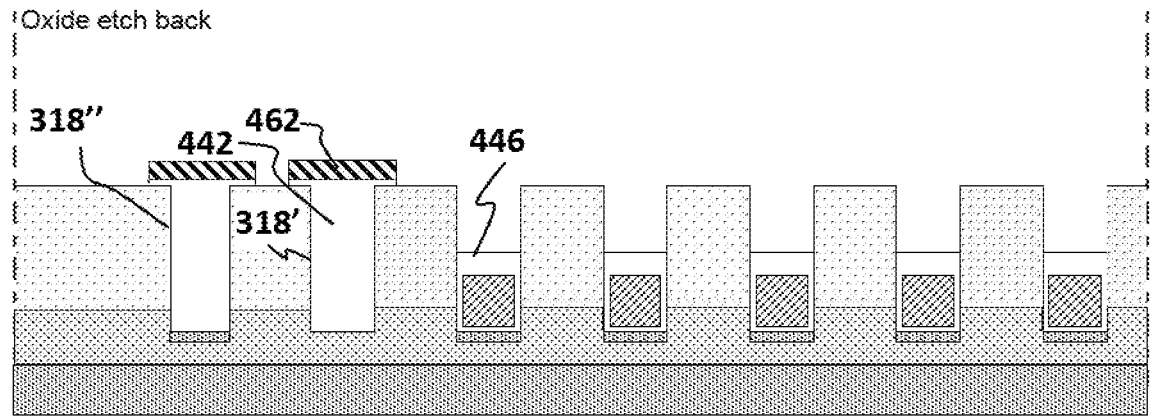
Figure 4N:
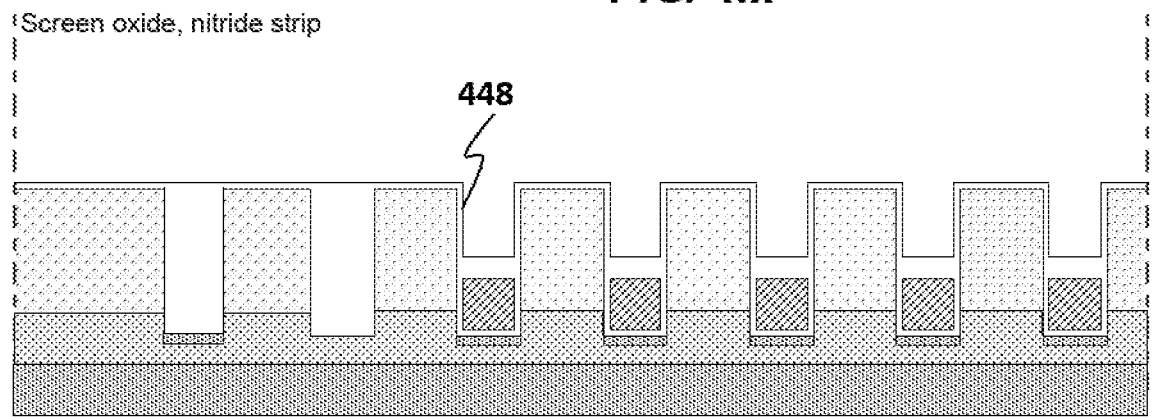
Figure 4O:
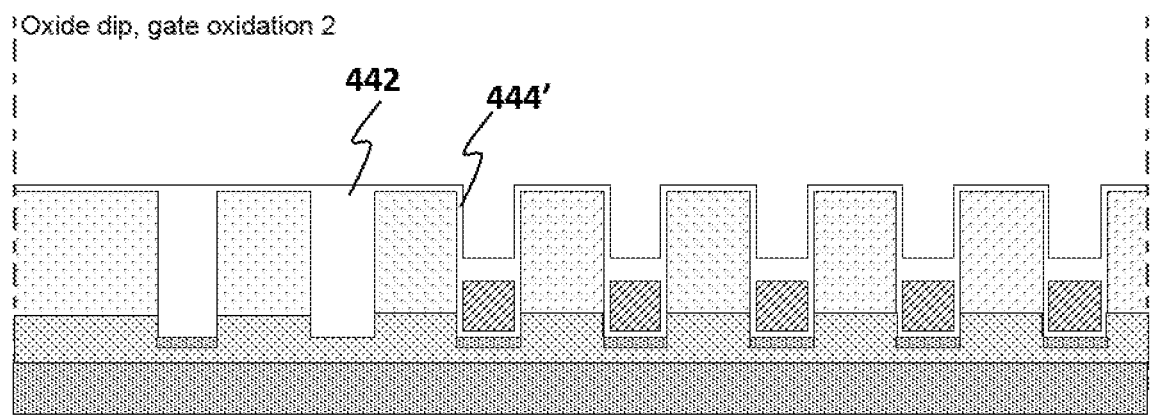
Figure 4P:
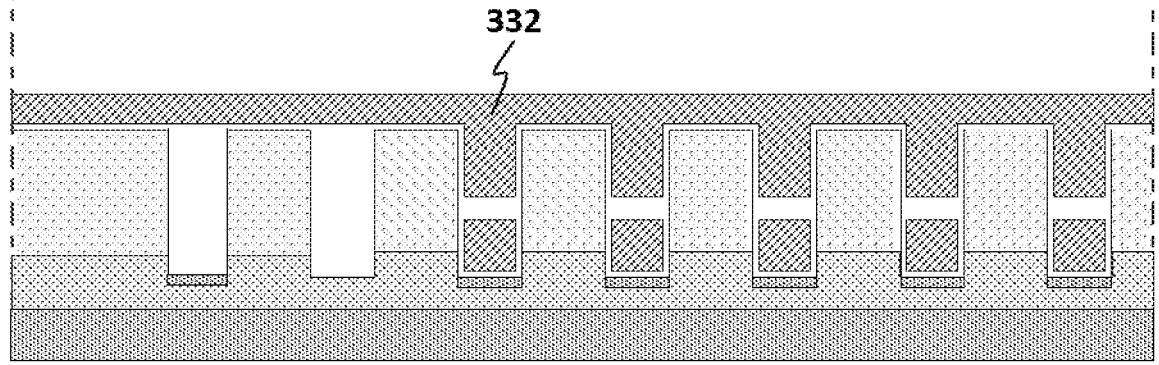
Figure 4Q:
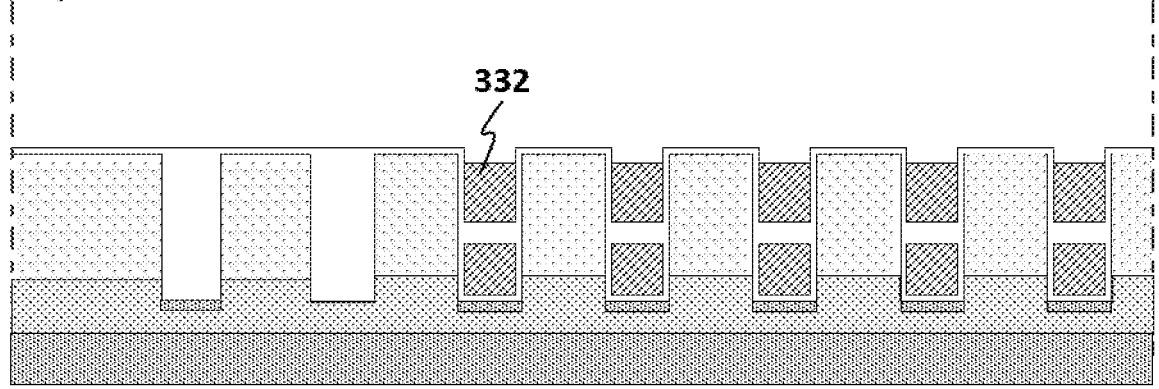
Figure 4R:
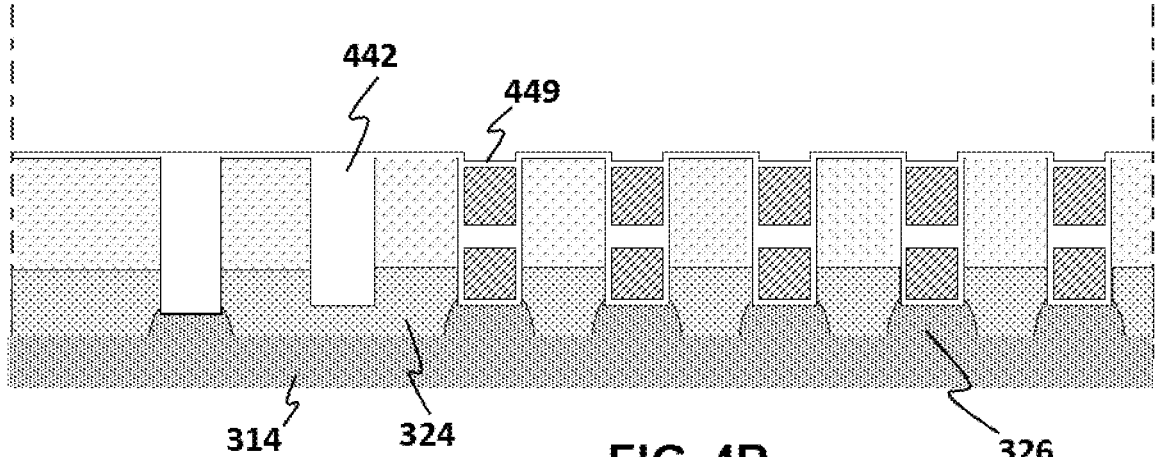
Figure 4S:
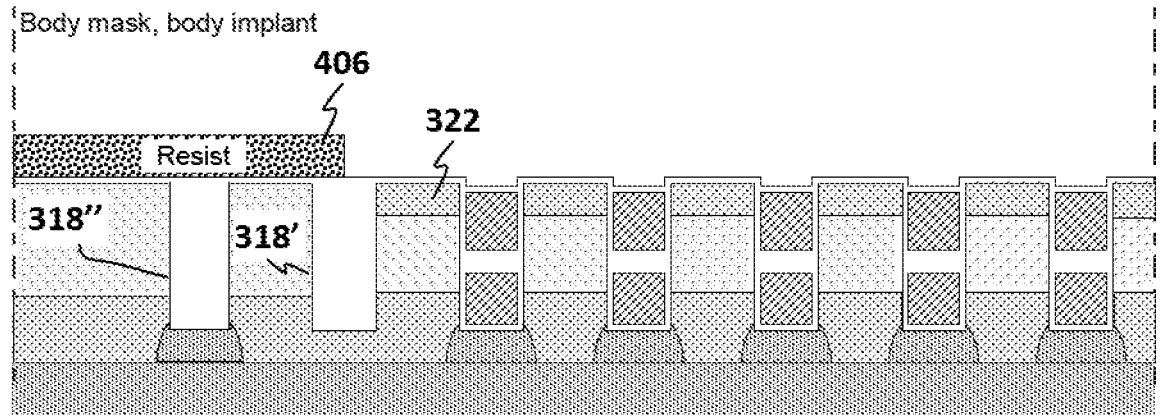
Figure 4T:
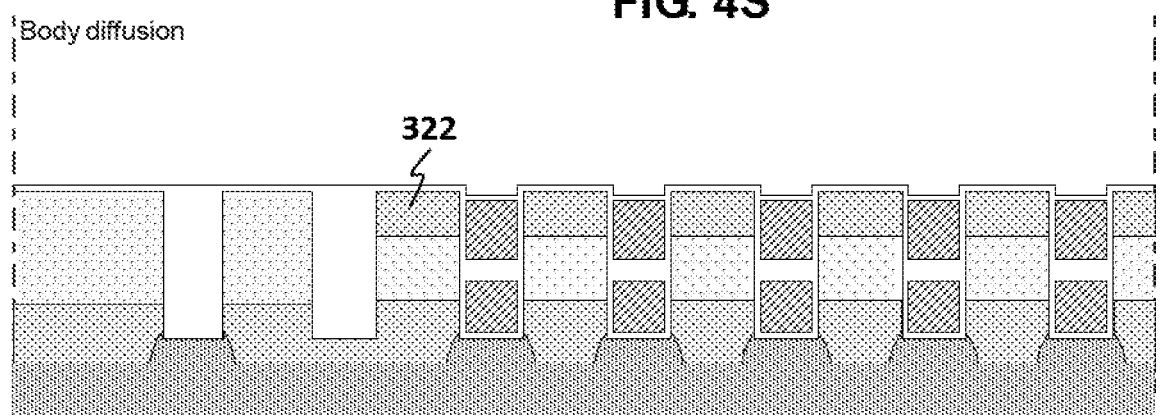
Figure 4U:
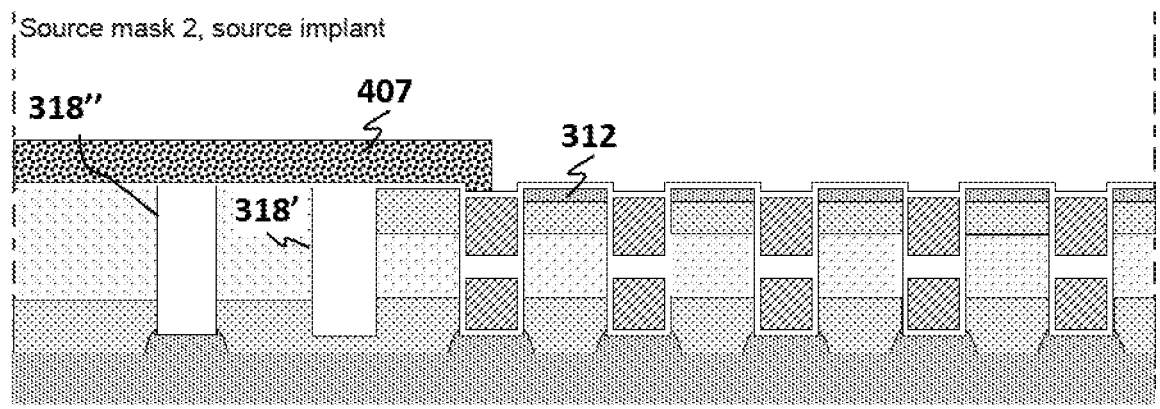
Figure 4V:
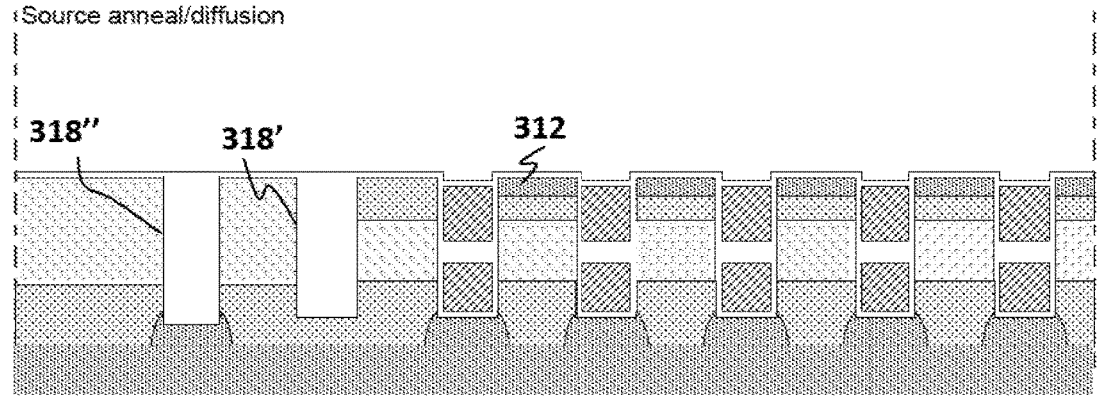
Figure 4W:
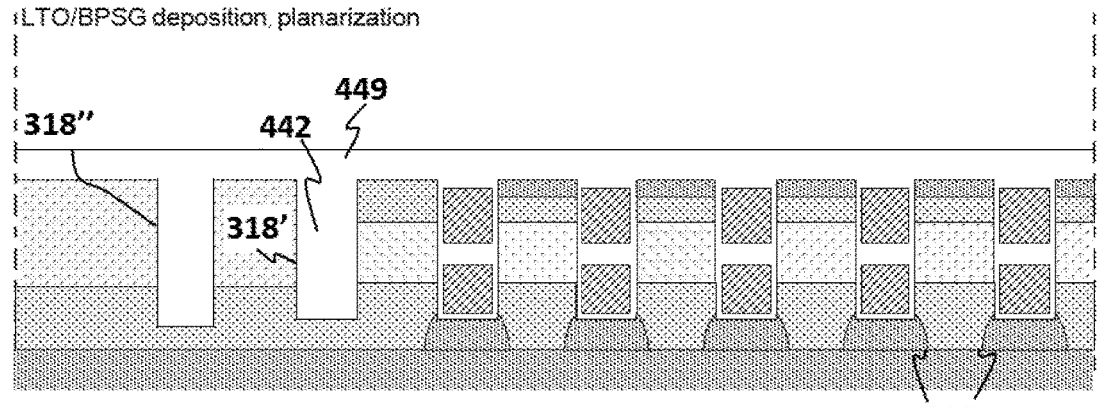
Figure 4X:
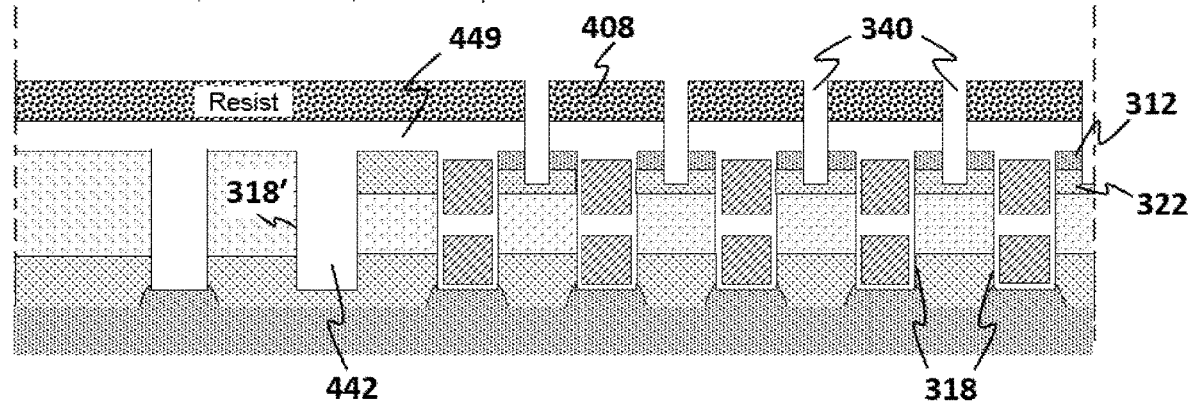
Figure 4Y:
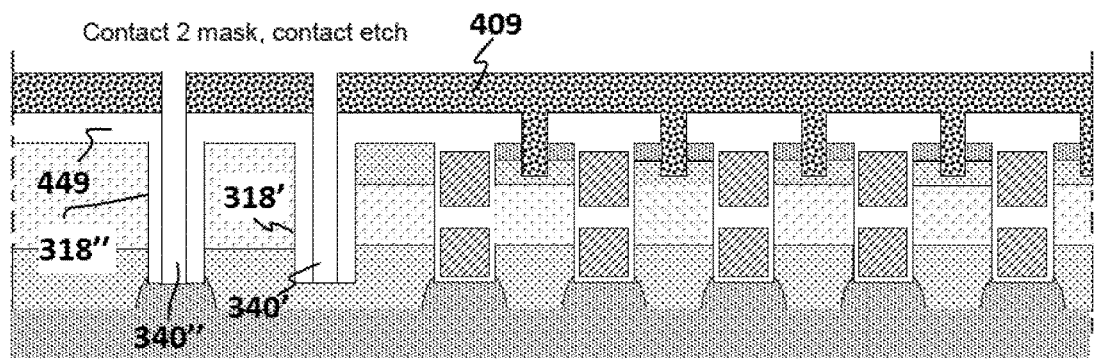
Figure 4Z:
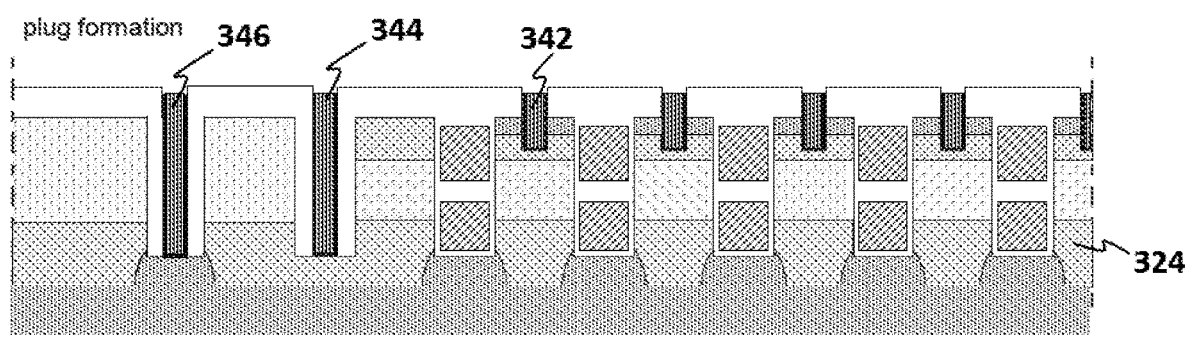
Figure 4Z:
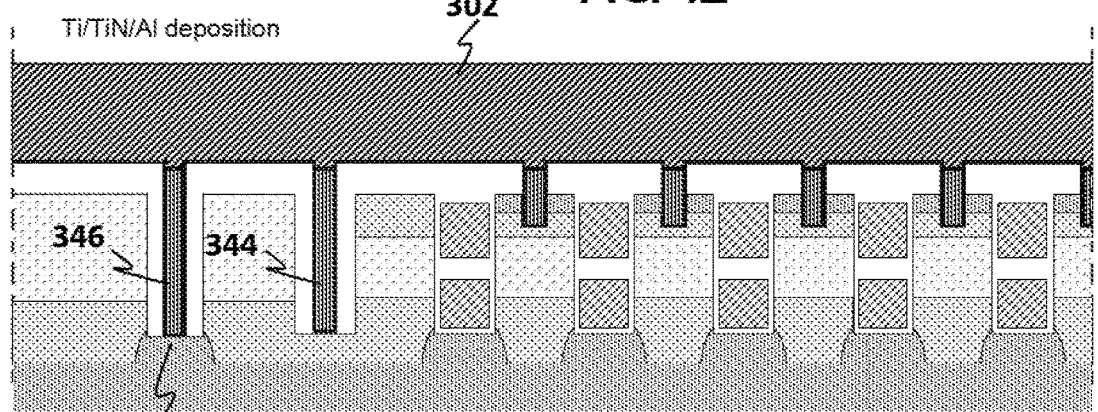
Figure 4Z:
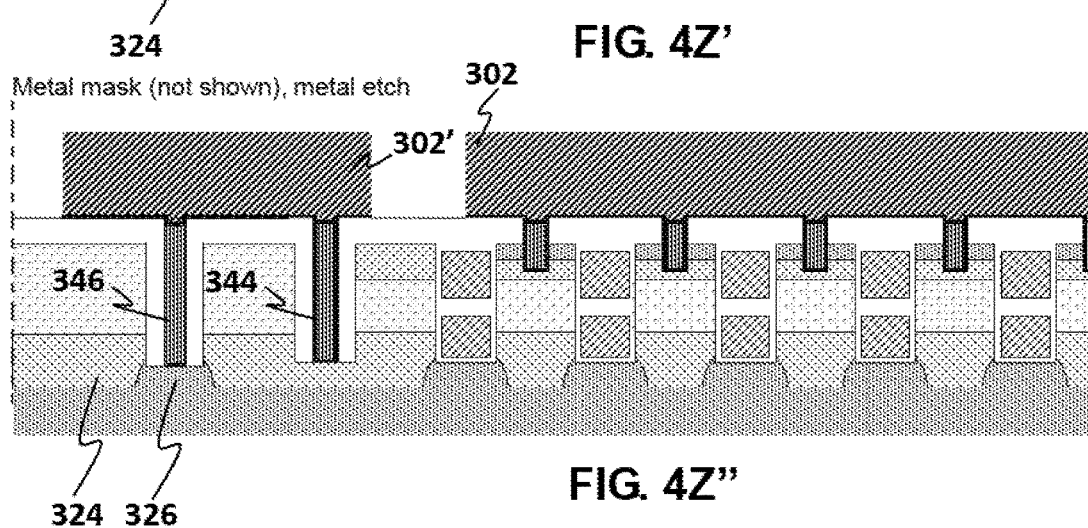
Figure 4A:
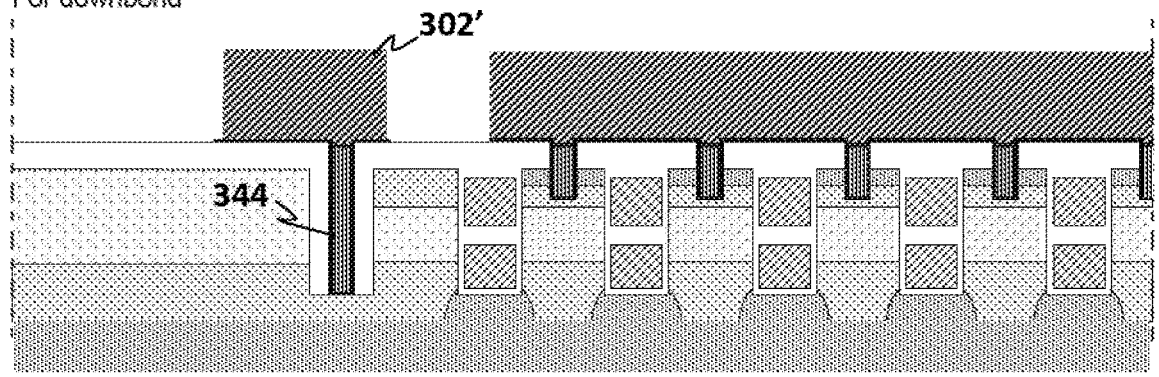
Figure 4A:
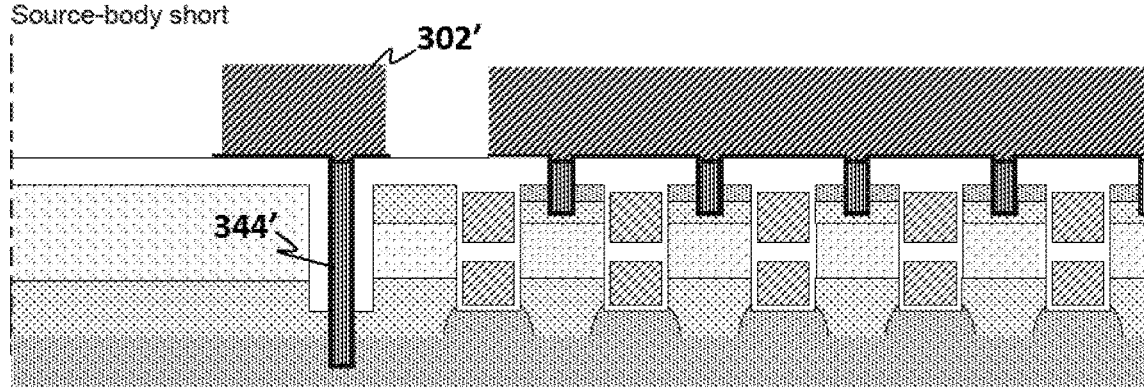

FIG. 4A-4Z" are a sequence of cross-sectional schematic diagrams illustrating fabrication of the device shown in FIG. 3A. The example is described in terms of the fabrication of an N-type device. However, those of skill in the art will appreciate that a P-type device may be described by switching P and N. As shown in FIG. 4A, this particular method of fabrication begins with a layered substrate 301 comprised of an N+ doped substrate layer 314, with a p-doped layer 324 and n-doped layer 310 formed on the substrate, e.g. by a combination of epitaxial growth and ion implantation. An insulating film 440, e.g., an oxide, is formed on a surface of the n-doped layer 310. A patterned resist mask 402 is formed on the exposed surface of the insulator layer 440 so that it can be selectively etched. After the resist mask is removed, the trenches 318 are etched through the oxide layer 440 and into the p-type 324 and n-doped 310 semiconductor material as shown in FIG. 4C.

As shown in FIG. 4D a mask 404 is applied for the source, and n-type dopants 414 comprised of that will later form the source regions 326 are implanted into portions of the p-type layer 324 beneath the bottoms of the trenches 318. The mask fills one of the trenches 318 identified as a bottom body contact trench 318' that will later be used to form a contact to the p-type layer 324. The rest of the trenches 318, including a bottom source contact trench 318" that will later be used to form a source contact, are not filled by the mask 404. The mask prevents implantation of the n-type dopants into the bottom of the bottom body contact trench 318'. After the mask 404 is removed, insulating material 442 is formed in the trenches, as shown in FIG. 4E. The insulating material 442 is formed in all the trenches including the bottom body contact trench 318' due to removal of the portion of the mask 404 filling that trench. The insulating material 442, e.g., an oxide, may be formed by a combination of chemical vapor deposition and densification followed by chemical-mechanical planarization (CMP). A protective layer 462, e.g., a nitride, is deposited onto the insulating layer 442. The protective layer 462 is resistant to a subsequent etch process that etches the insulating material 442.

A cover mask 405 is formed on portions of the protective layer 462 and subjected to patterning and etch processes that removes most of the protective layer except for over the bottom body contact trench 318' and the bottom source contact trench 318" adjacent the bottom body contact trench 318', as shown in FIG. 4G. As shown in FIG. 414 the insulating material 442 is subsequently etched away except for the portion underneath the remaining portions of the protective layer 462 over the bottom body contact trench 318' and the bottom source contact trench 318". A first gate insulating layer 444, an oxide, is formed over the sidewalls and bottoms of the trenches 318 and the exposed substrate surface as shown in FIG. 4I. The first gate insulating layer 444 may be formed by oxidizing the exposed surfaces of the semiconductor material of the epitaxial layer.

In FIG. 4J, electrically conductive gate material 334, e.g., polycrystalline silicon, is deposited in the trenches 318 and is etched backed as shown in FIG. 4K to form the second gate electrodes 334. Then, as shown in FIG. 4L, an inter-gate dielectric 446, e.g. a high density plasma (HDP) oxide is formed over the second gate electrodes 334. Formation of the inter-gate dielectric 446 may be followed by chemical-mechanical planarization to remove excess material.

The inter-gate dielectric 446 is then etched to a desired thickness above the second gate electrodes 334 and to remove dielectric material from upper portions of the gate trench sidewalls and the exposed surface of the epitaxial layer 310, as shown in FIG. 4M. The first gate electrodes 332 may then be formed in the gate trenches over the inter-gate dielectric. By way of example, as shown in FIG. 4N, the surface of the epitaxial layer and trench sidewalls may be covered by a protective material 448, e.g., a screen oxide during an etch process that removes the remaining protective layer 462 over the insulator filled the bottom body contact trench 318' and the bottom source contact trench 318". Next, as shown in FIG. 4O, the protective material 448 may be removed e.g., by an oxide dip and an insulator layer 444' for the first gate 332 may be formed over the trench sidewalls and exposed portions of epitaxial layer 310, e.g., by thermal oxidation.

FIG. 4P shows the deposition of conductive material, which after etching shown in FIG. 4Q forms the gates 332 of the fist transistor. As shown in FIG. 4R, the assembly is annealed, causing the n-type dopants 414 to diffuse into the p-doped layer 324 and form the sources 326 of the second transistor in contact with the N+ substrate 314. Insulating material 449 may be formed over the exposed portions of the gates 332 during this step, e.g., by thermal oxidation.

In FIG. 4S, a body mask 406, e.g., a patterned layer of photoresist is formed and p-type ions are implanted into upper portions of the epitaxial layer to form body regions 322 for the first transistor. The partially completed device may be annealed again to allow the p-type dopants to diffuse and form the body regions 322, as shown in FIG. 4T. Next, as shown in FIG. 4U a second source mask 407 is formed on the surface of the partially-completed device, and n-type dopants are implanted into mesas between adjacent trenches containing gate electrodes 332, 334. The device may then be subjected to a third annealing process to diffuse the n-type dopants to form the sources 312 of the first transistor, as shown in FIG. 4V.

Additional insulating material 449, e.g. a low temperature oxide (LTO) and borophosphosilicate glass (BPSG) may be formed over the surface of the device proximate the sources 312 and gate electrodes 332 of the first transistor and over the insulating material 442 in the bottom body contact trench 318', as shown in FIG. 4W. The additional insulating material 449 may be planarized after its formation, e.g. by CMP. Source/body contacts are then formed. For example, as shown in FIG. 4X, a contact mask 408 may be applied, then the contact openings 340 can be etched through the insulating material 449 and the source regions 312 into the body regions 322 in the mesas between adjacent gate trenches 318. In some implementations provisions for electrical contact from the upper side of the device to the body region 324 for the second transistor may also be made. For example, FIG. 4Y shows formation of a second contact mask 409 and subsequent etching of the insulating material 442 in the bottom body contact trench 318' and the bottom source contact trench 318" all the way through to the body layer 324 and the source region 326 respectively to form contact openings 340' and 340". In FIG. 4Z, the resistive mask 409 is stripped and conductive contacts 342, 344 and 346 are formed in the contact openings 340, 340' and 340", respectively. The conductive contacts, e.g., tungsten plugs may be protected against interdiffusion between the contact metal and the semiconductor material of the substrate by a diffusion barrier, e.g., Titanium/Titanium Nitride.

A patterned metal layer 302 may then be formed to provide external contacts for the sources of the first and second transistors, as shown in FIG. 4Z'. By way of example, and not by way of limitation. Ti/TiN diffusion barrier and Al metal may be formed on the surface of the device proximate the first transistor. As shown, in FIG. 4Z", a resist mask may be deposited and patterned and the metal layer 302 is etched to form two isolated source metal regions 302, 302'. One metal region 302 provides source contact for the first transistor and the second metal region 302' provides contact to the second transistor for shorting the source and body by making contact respectively with source region 326 via source contact 346 and body region 324 via body contact 344. The metal mask may then be stripped at the end of processing. In the example shown in FIG. 4A-FIG. 4Z", contact is made between the body 324 and source 326 of the lower MOSFET via the body contact 344, the metal region 302', and the source contact 346.

There are a number of alternative implementations in which source-body contact for the second MOSFET is accomplished using just the body contact 344. In such implementations, the source contact 346 and its bottom source contact trench 318" may be omitted. By way of example, and not by way of limitation, as shown, in FIG. 4AA the body contact 344 may be used to implement a down-bond connection, in which a metal connection is provided in a semiconductor packaging process to connect the metal layer 302' to a lead frame where a bottom of the substrate layer 314 is electrically connected to (not shown). Alternatively, as shown in FIG. 4AA', the body contact opening 340' may be etched through the body region 324 into the substrate layer 314 so that the body contact 344' penetrates into and makes contact with the body region 324 and the source region 326 through the substrate layer 314 thereby providing a source-body short.

It is noted that in alternative implementations, contact may be made to the source regions 326 through the substrate layer 314 via a metal layer 304 formed on the back side of the substrate layer 314 as shown in FIG. 3A.

Figure 5A:
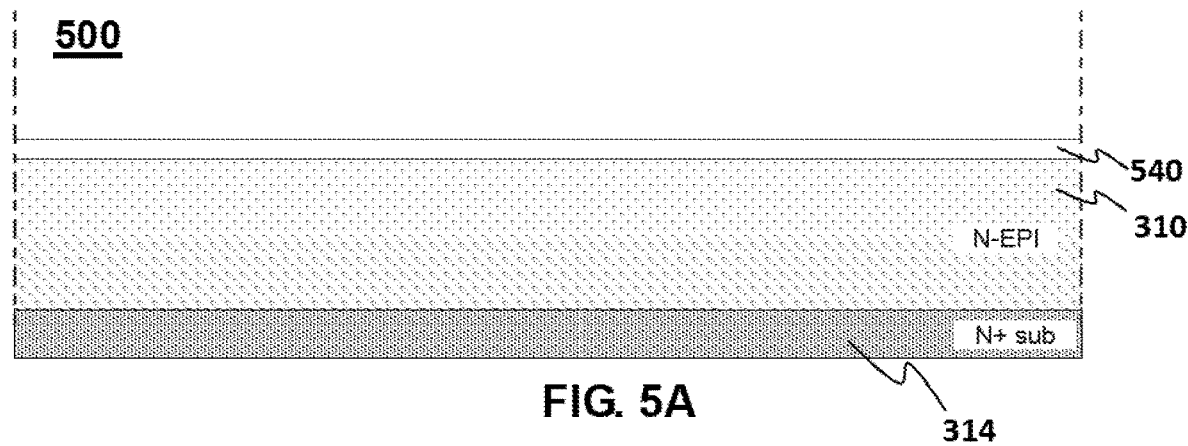
FIGS. 5A-5X are a sequence of cross-sectional schematic diagrams illustrating fabrication of a switching device of the type shown in FIG. 3B according to an aspect of the present disclosure.
Figure 5B:
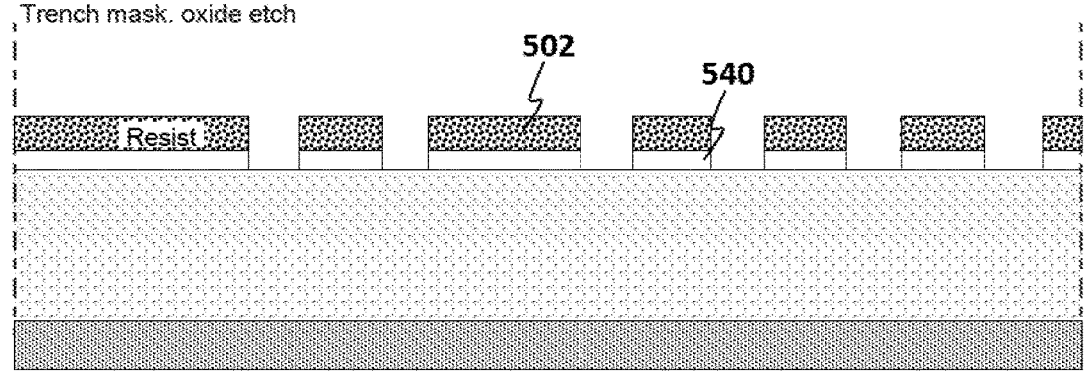
Figure 5C:
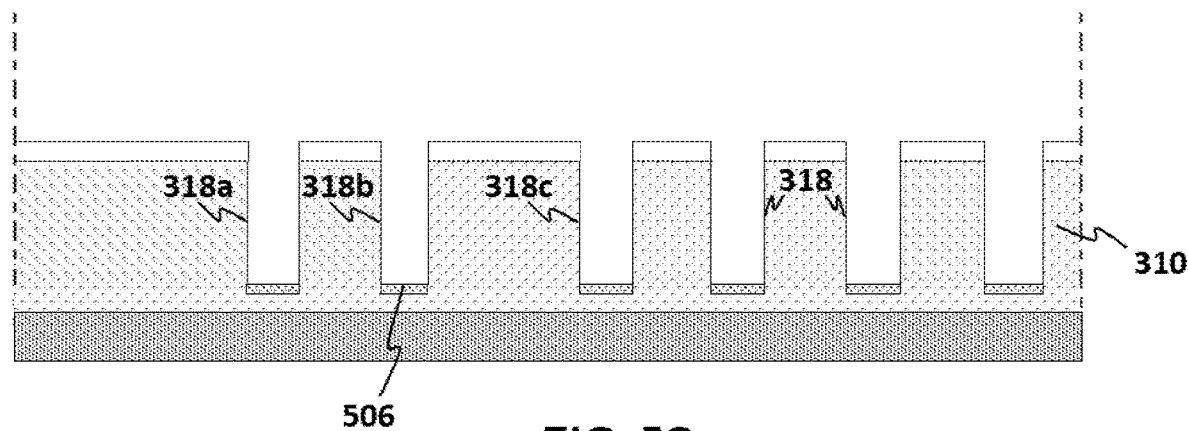
Figure 5D:
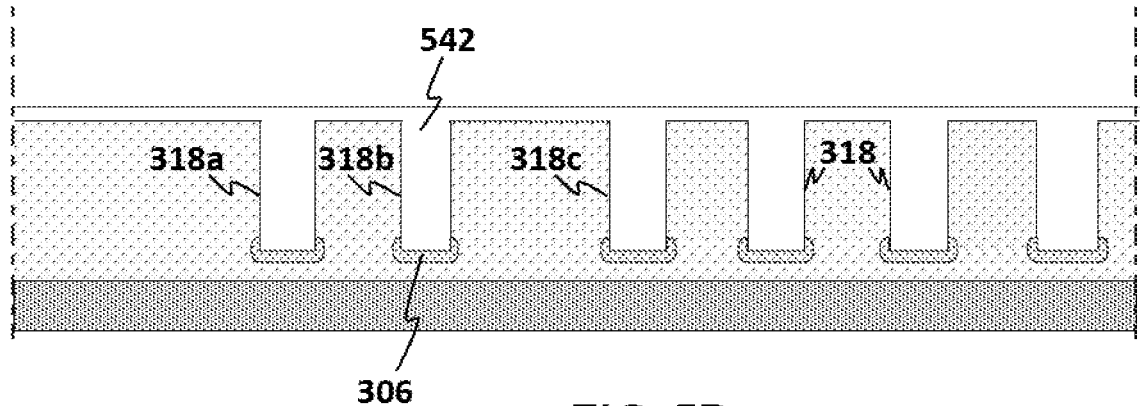
Figure 5E:
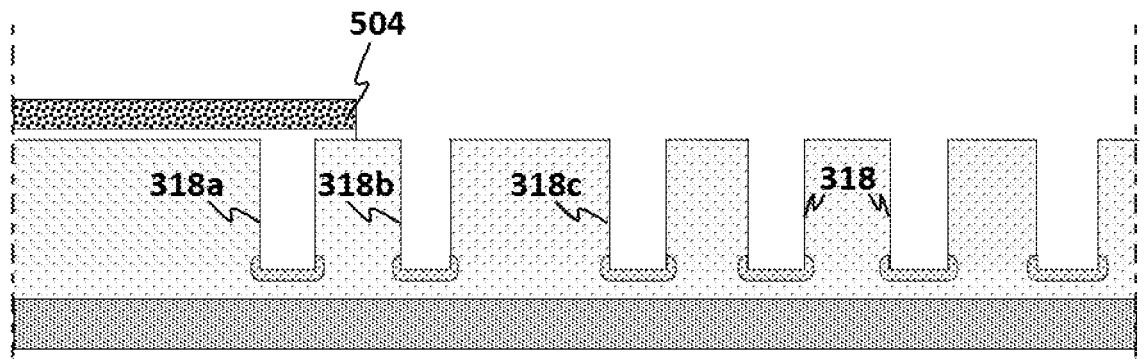
Figure 5F:
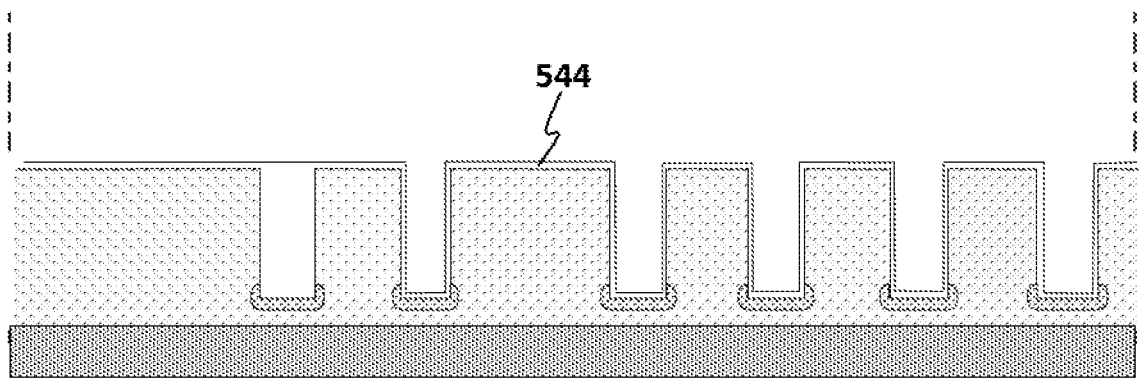
Figure 5G:
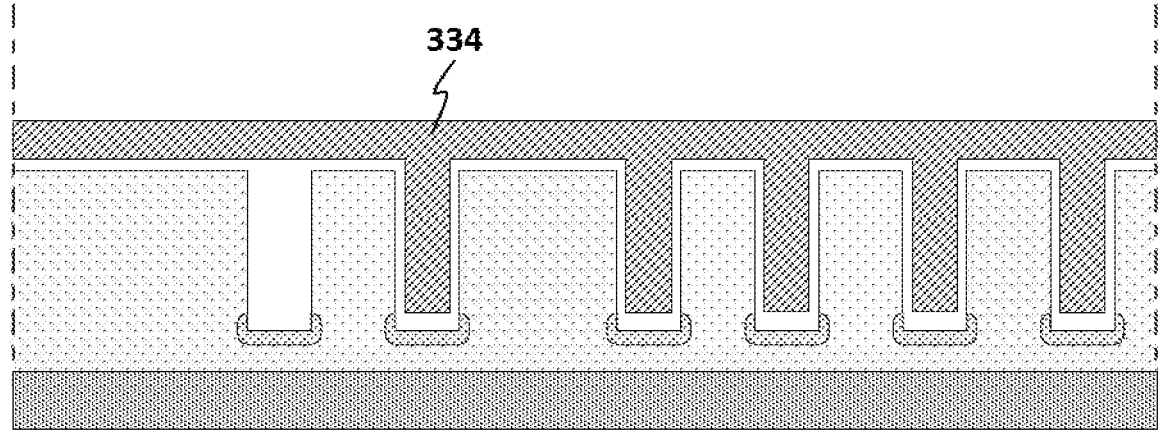
Figure 5H:
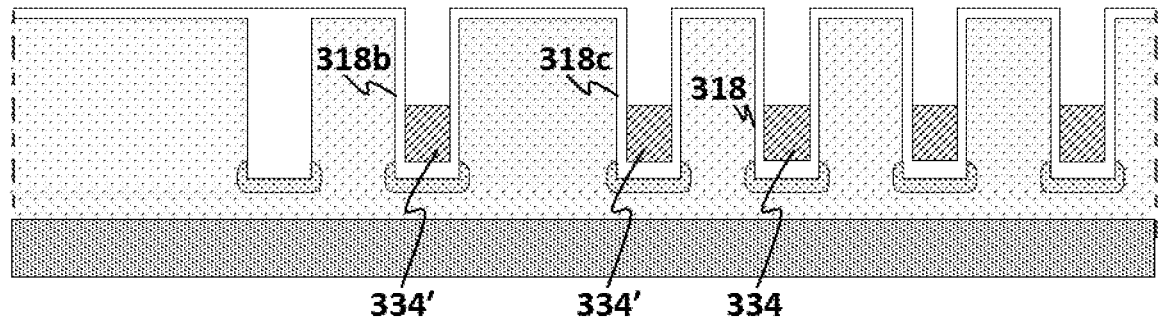
Figure 5I:
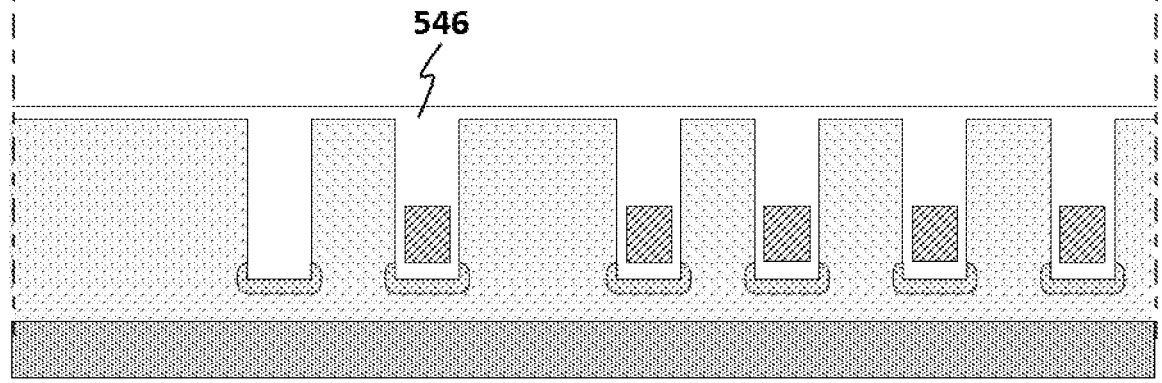
Figure 5J:
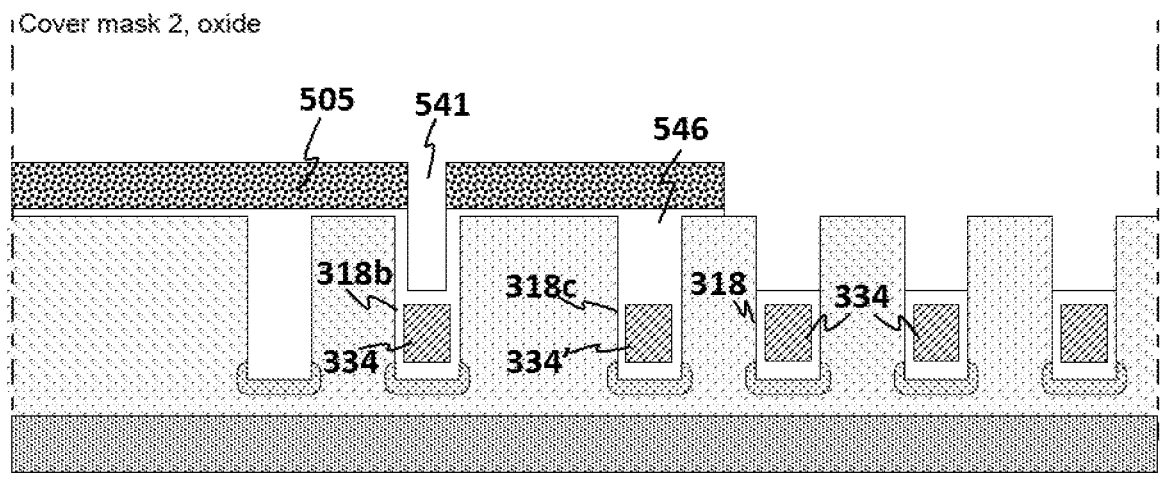
Figure 5K:
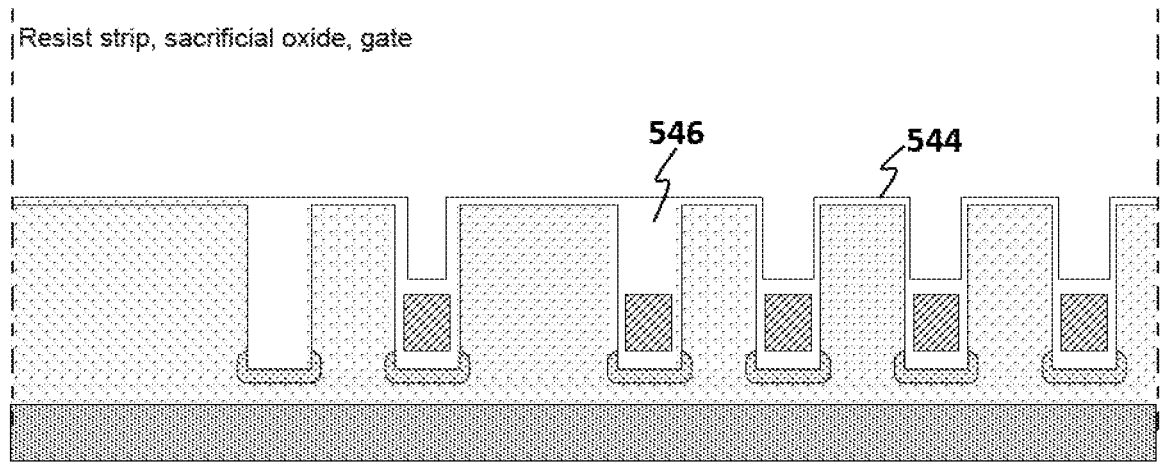
Figure 5L:
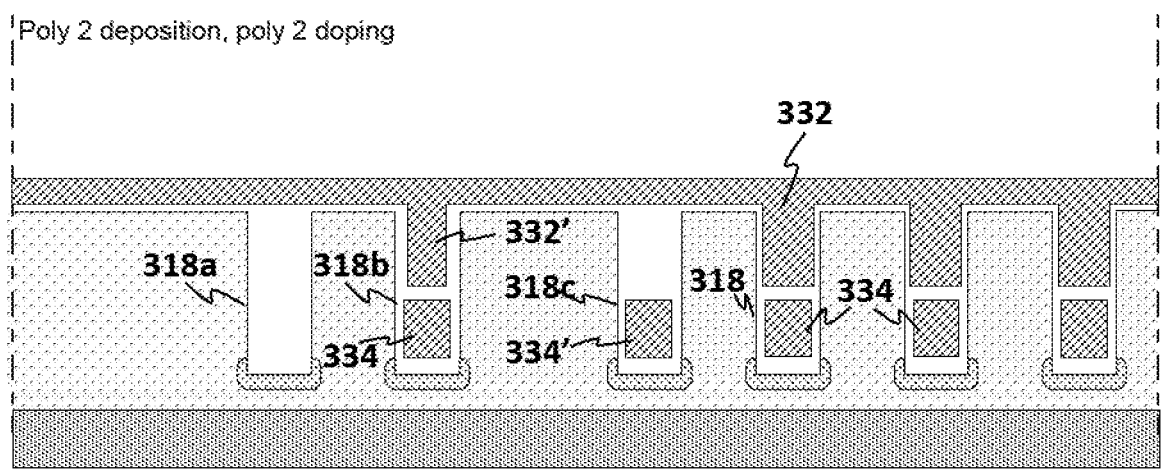
Figure 5M:
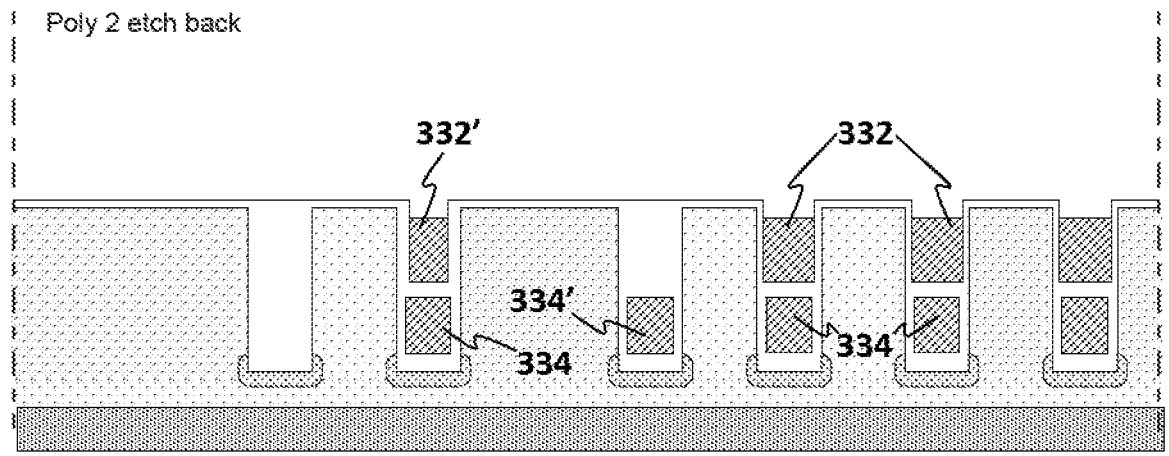
Figure 5N:
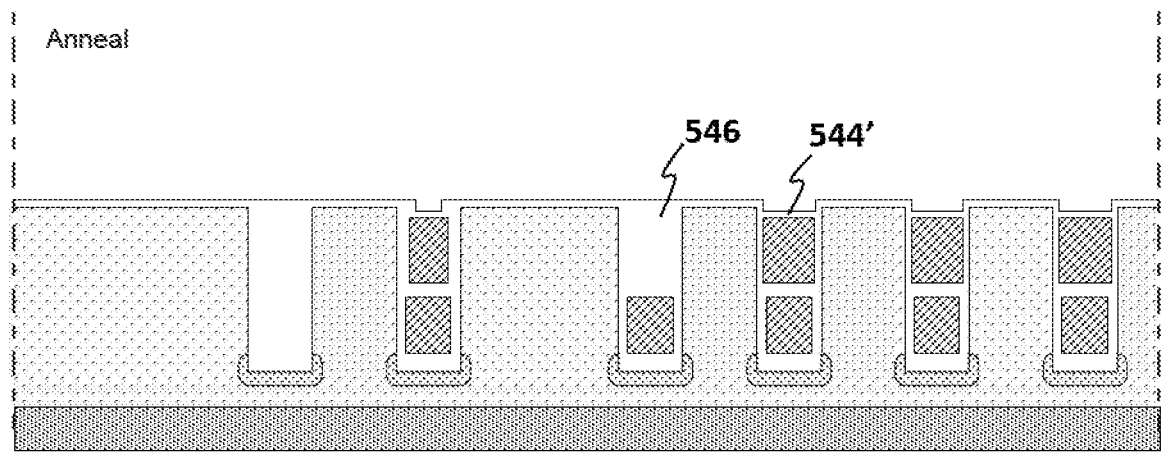
Figure 5O:
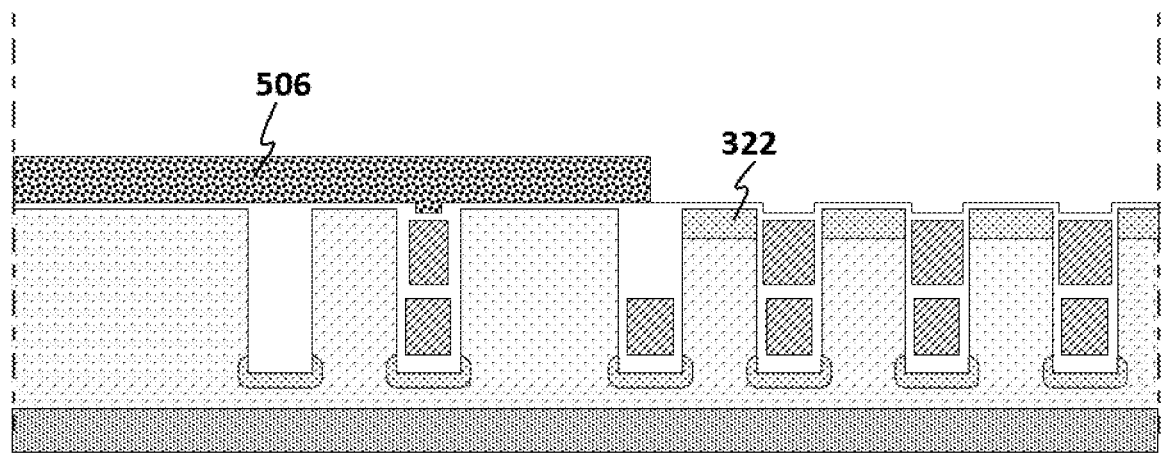
Figure 5P:
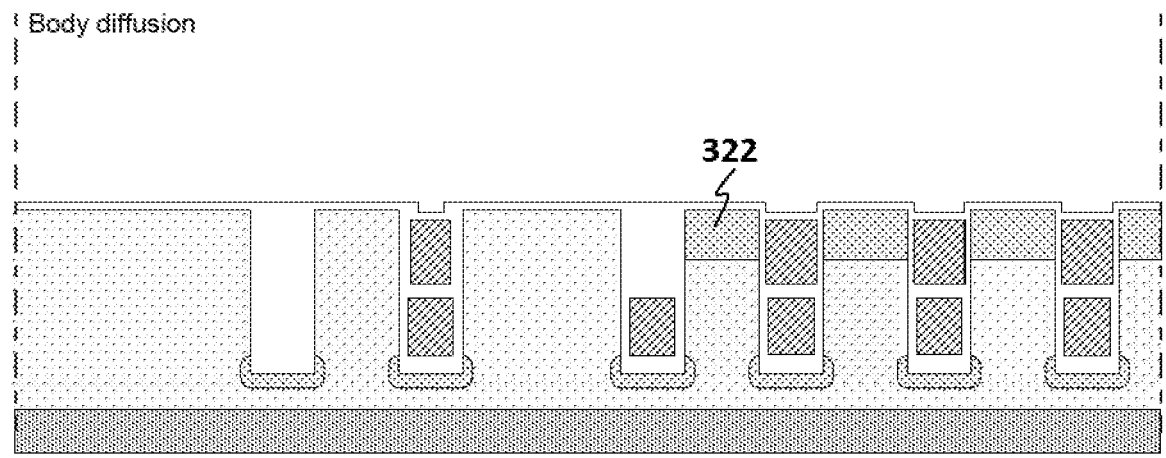
Figure 5Q:
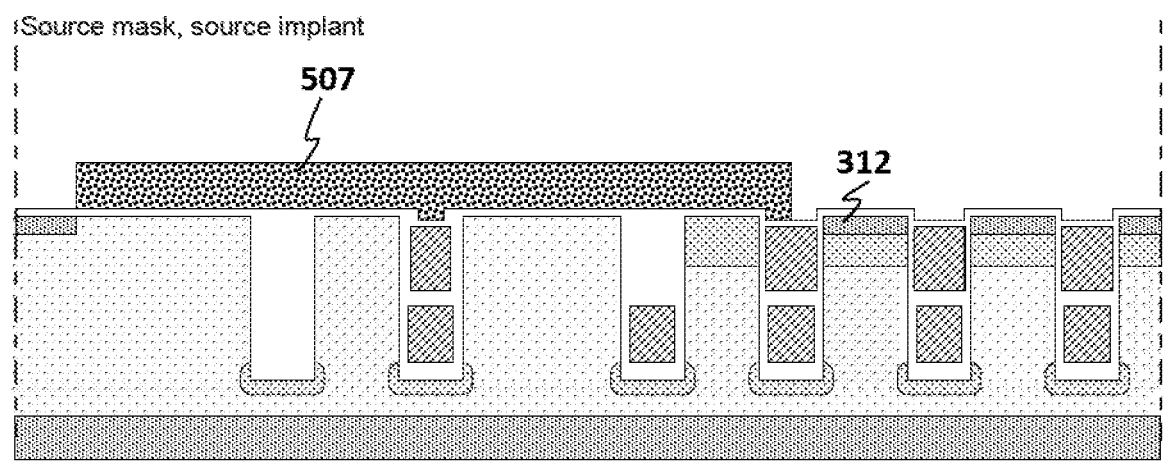
Figure 5R:
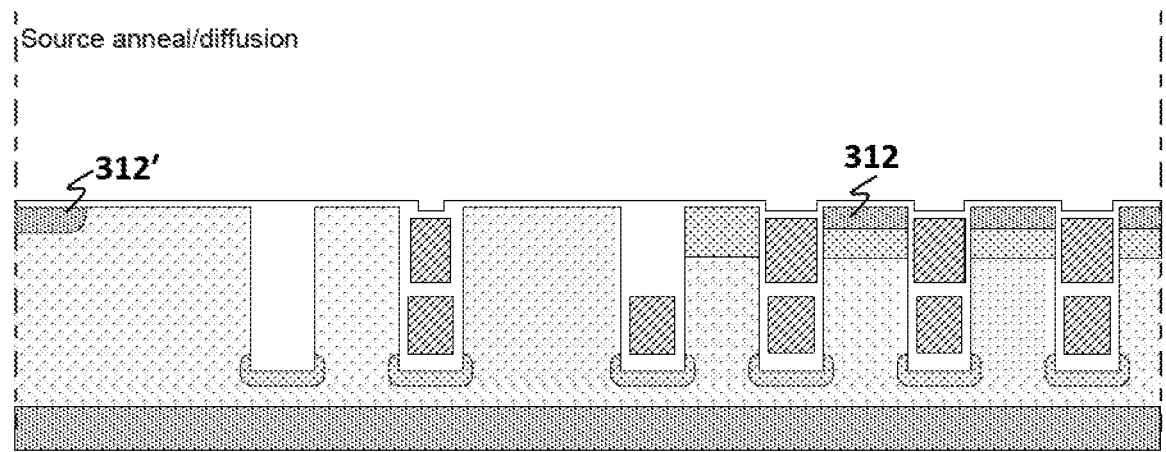
Figure 5S:
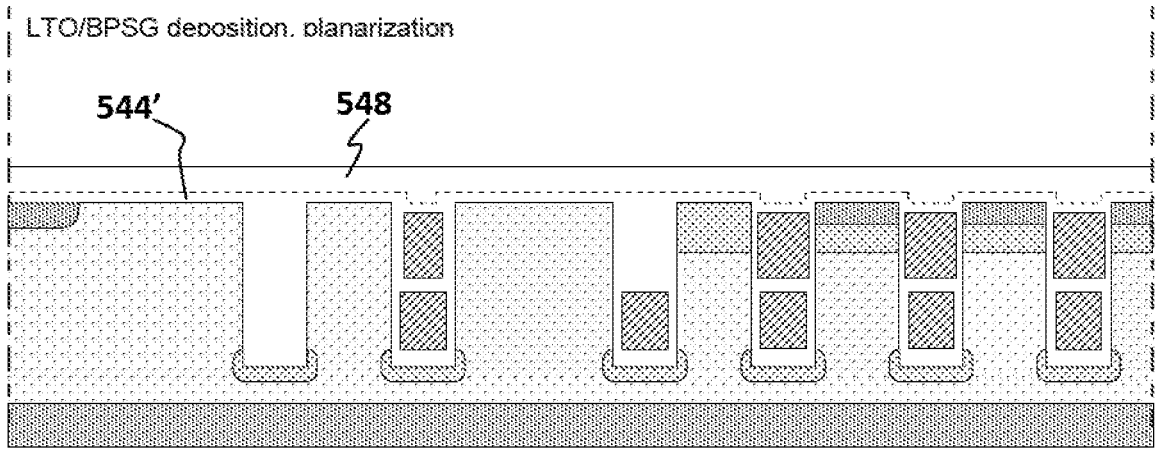
Figure 5T:
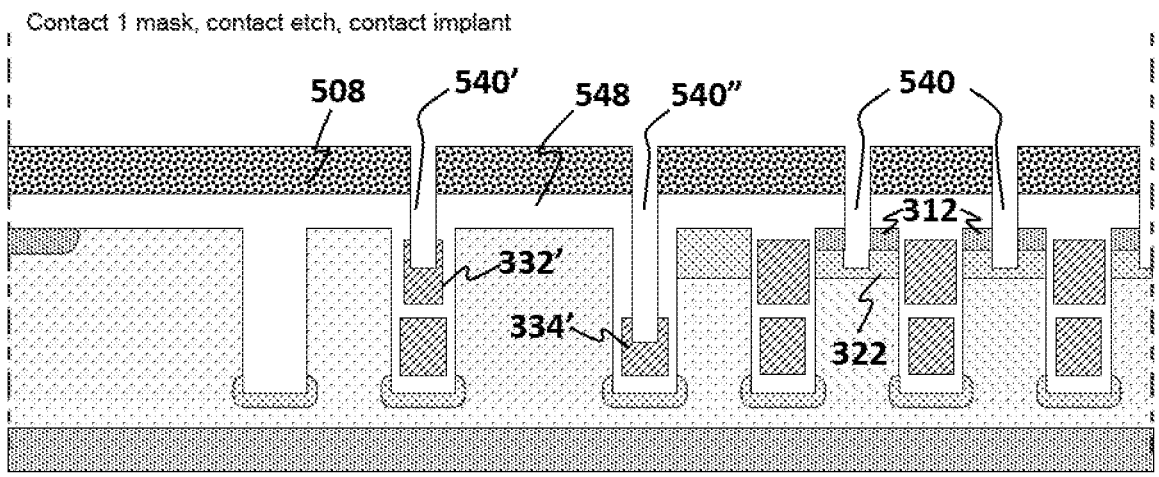
Figure 5U:
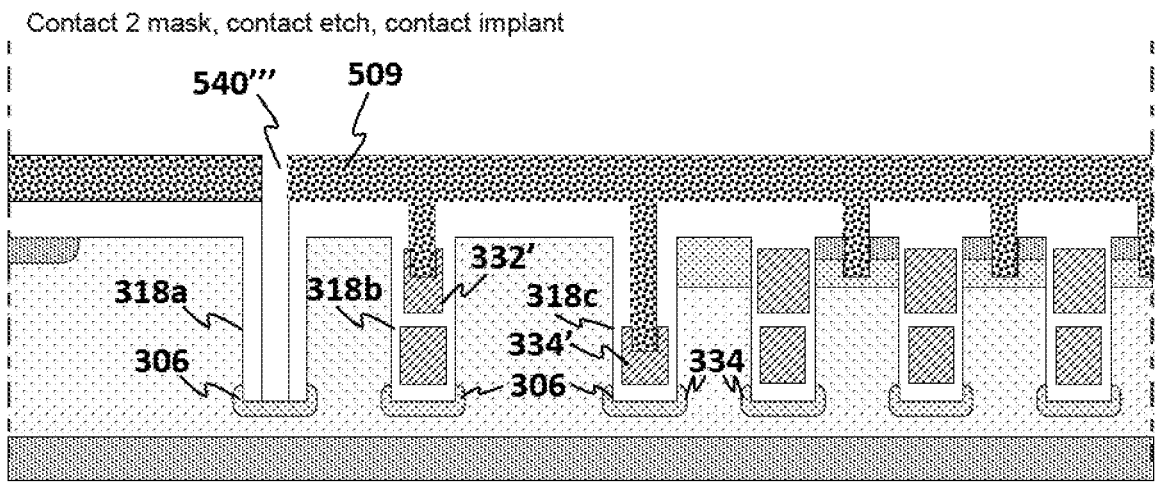
Figure 5V:
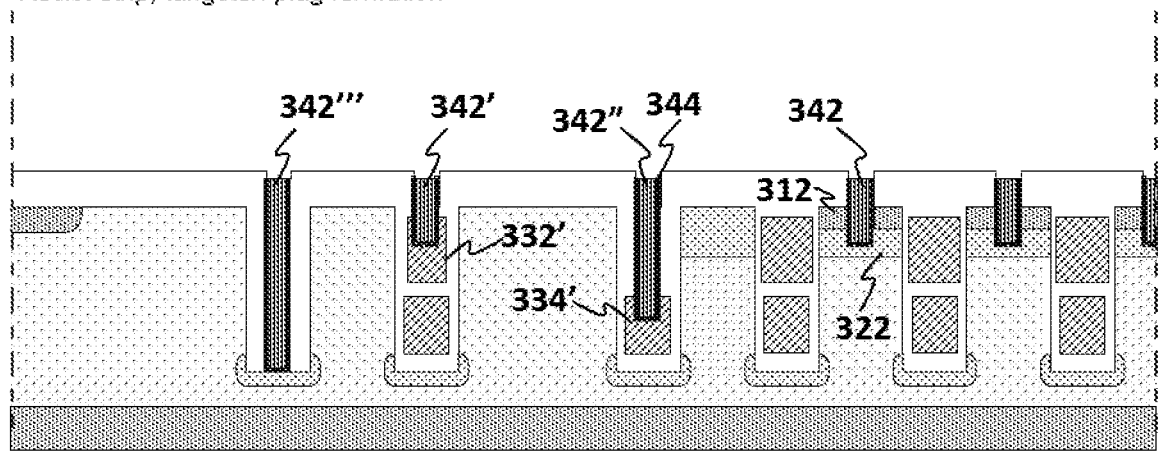
Figure 5W:
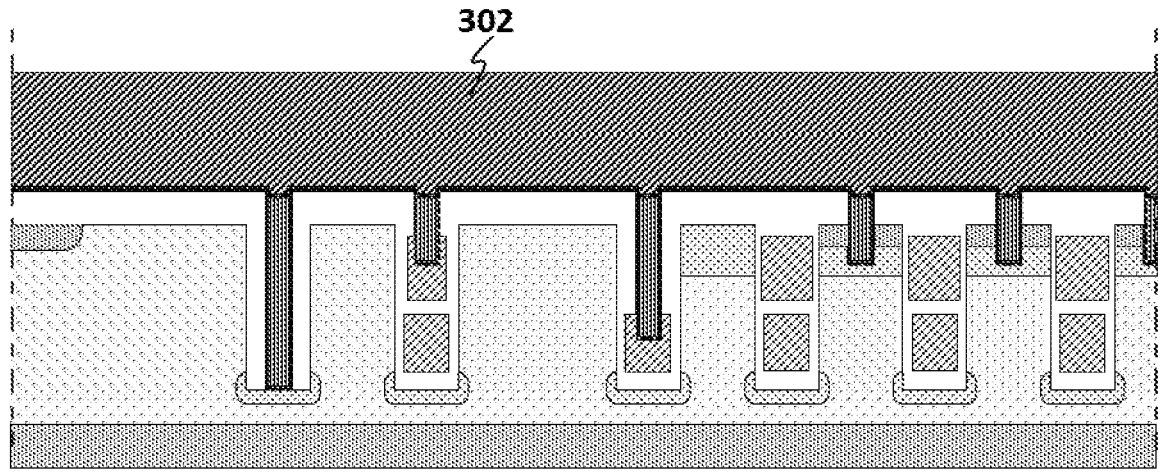
Figure 5X:
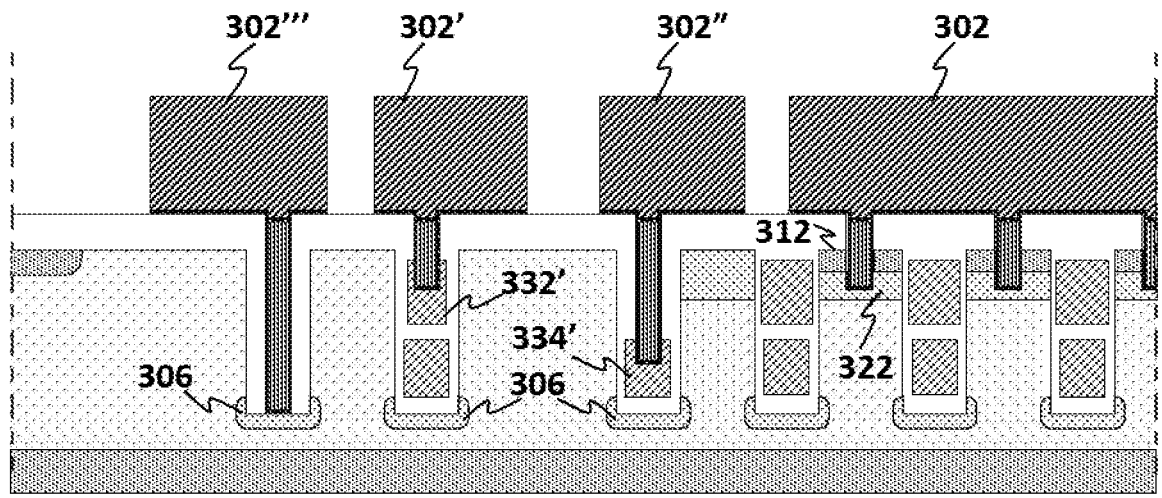

FIGS. 5A-5X are a sequence of cross-sectional schematic illustrating an example of fabrication of a device of the type shown in FIG. 3B. Because the device 300' is similar to the device 300, there are similarities between the fabrication sequence described above with respect to FIGS. 4A-4Z" and the sequence illustrated in FIGS. 5A-5X. As with the example illustrated in FIGS. 4A-4Z", the example in FIGS. 5A-5X is described in terms of fabrication of an N-type device. Again, those of skill in the art will appreciate that a P-type device may be described by switching P and N.

As shown in FIG. 5A, an insulating film 540 is formed on starting substrate 301' having an N-type epitaxial layer 310 formed on an N+ substrate 314. For example, an insulating layer 540 is formed on the exposed surface of the epitaxial layer 310, e.g., by oxidation, as shown in FIG. 5A and patterning of insulating layer 540 with a resist mask 502, as shown in FIG. 5B may proceed as described above with respect to FIGS. 4A-4B. Trenches including gate trenches 318, a down-bond contact trench 318a for contact to the counter-doped well regions 306, a top gate contact trench 318b and a bottom gate contact trench 318c are then etched through the oxide layer and into the epitaxial layer 310, as shown in FIG. 5C. Additionally, p-type dopants 506 are implanted into epitaxial layer at the bottom of the trenches 318, 318a for the counter-doped well regions 306.

After the mask 502 is removed, insulating material 542, an HDP oxide, is formed in the trenches 318, 318a followed by chemical-mechanical planarization (CMP), and annealing to diffuse the p-type dopants 506 to form the well regions 306, as shown in FIG. 5D. A cover mask 504 is then formed over part of the surface of the insulating material 542 over the down-bond contact trench 318a and the rest of the insulating material 542 is etched away as shown in FIG. 5E. After the cover mask 504 is removed, a liner layer 544 of insulating material, e.g., oxide is formed over the bottoms and sidewalls of the trenches 318 and over exposed portions of the surface of the epitaxial layer 310, as shown in FIG. 5F. The liner layer 544 may be formed, e.g. by thermal oxidation.

Next, as shown in FIG. 5G conductive material is deposited to be used to form the ACCUFET gates 334 in gate trenches 318 and a bottom gate runner 334' in bottom gate contact trench 318c. The conductive material may be polycrystalline silicon, into which dopants are implanted to make it more electrically conductive. The conductive material is then etched back to form the ACCUFET gates 334 and bottom gate runner 334' in the lower portions of the gate trenches 318 and bottom gate contact trench 318c. In FIG. 5I, an inter-gate insulating material 546 is formed over the ACCUFATE gates 334. By way of example, and not by way of limitation, the additional insulating material 546 may be an HDP oxide layer that is densified and subjected to CMP after densification.

As with the device 300, provision is made for independent and electrically isolated contact to the gates 332, 334 of the two different FETs in the trenches 318. By way of example, as depicted in FIG. 5J a second cover mask 505 may be formed and patterned and the insulating material 546 in the trenches 318 may be etched. In this example the second cover mask 505 protects part of the inter-gate insulating material 546 in the top gate contact trench 318b to define an opening 541 for a top gate runner for the MOSFET gates 332 while covering the insulating material 546 in trenches 318a and 318c that will later be used respectively to form a contact to the counter-doped well regions 306 and to form a contact to the ACCUFET bottom gate runner 334'. After etching to form the opening 541 and remove a remaining portion of the insulating material 546, the second cover mask is then stripped, and a second gate insulating material 544, e.g., a gate oxide, is formed as shown in FIG. 5K. The second gate insulating material 544 may be formed by thermal oxidation of exposed portions of the epitaxial layer 310, such as exposed upper parts of the sidewalk of the trenches 318. A second layer of electrically conductive material 332 is then formed in the trenches. This conductive material, e.g., doped polysilicon is used to form the MOSFET Gates 332 and a top gate runner 332'. For example, as shown in FIG. 5M, the conductive material 332 is etched back to form the gates 332 in trenches 318 and the top gate runner 332' in top gate contact trench 318b for the MOSFET. Protective dielectric material 544' may then be formed over the gates 332 and gate runner 332', as shown FIG. 5N, e.g., by thermal oxidation, to protect them during subsequent processing.

A body implant mask 506 is then applied and p-type dopants are implanted through openings in the mask as shown in FIG. 5O followed by removal of the mask and annealing as shown in FIG. 5P to diffuse the p-type dopants to form body regions 322 for the MOSFET. To form the MOSFET source regions 312, a source mask 507 is applied and n-type dopants implanted as shown in FIG. 5Q followed by removal of the mask and annealing to diffuse the n-type dopants, as shown in FIG. 5R. The same masking, implant, and diffusion sequence shown in FIG. 5O-5P may also form a channel stop region 312' that surrounds the device.

To thicken the layer of electrical insulator on top of the device, a top insulator 548 may be deposited on the second gate dielectric 544 and protective dielectric 544', as shown in FIG. 5S. By way of example, the top insulator 548 may be formed by depositing an LTO/BPSG layer, which is then planarized, e.g., by CMP Openings 540, 540',540",540' for contacts to the sources 312, the top gate runner 332', the bottom gate runner 334', and the well regions 306 may then be formed through the top insulator 548, the inter-gate insulator 546 in the ACCUFET bottom gate runner trench 318c, and the insulating material 542 in the down-bond contact trench 318a. This may involve two separate mask and etch processes. By way of example, as shown in FIG. 5T a first contact mask 508 may be applied and the contact openings etched 540, 540', and 540" through the oxide layer 548. In a subsequent process depicted in FIG. 5U, the first contact mask 508 is stripped and replaced with a second contact mask 509 that fills the previously formed openings 540, 540', 540" and defines the opening 540' for the contact to the well regions 306. The second contact mask 509 protects against undesired deepening of the source contact openings 540 and the gate runner contact openings 540', 540" during the etch process that forms the contact opening 540" to the well region at the bottom of the down-bond contact trench 318a.

After the contact openings have been formed, contacts are formed in the openings. This may involve formation of a layer diffusion barrier metal that lines the openings followed by formation of metal (e.g., tungsten) plugs. For example, as shown in FIG. 5V the resistive mask is stripped and a barrier metal layer 344 (e.g., Ti/TiN) and tungsten plugs 342, 342', 342", and 342''' are formed in the contact openings 540, 540', 540", and 540''', respectively. Next, as shown in FIG. 5W a metal layer 302 (e.g., aluminum) is deposited onto the assembly surface and makes electrical contact with the plugs 342, 342', 342", and 342'''. The metal layer 302 may then be divided into separate regions 302, 302', 302" and 302''' in a conventional lithography and metal etch step to provide separate electrically isolate external contacts to the MOSFET sources 312 and body regions 322 the MOSFET gate runner 332', the ACCUFET gate runner 334' and the ACCUFET well regions 306.

It is noted that in some implementations, contact may be made to the well regions 306 to a metal layer on the back side of the substrate layer 314 through a down-bond connection, in which a metal connection is provided in semiconductor package process to connect the metal layer 302' to a lead frame where the metal layer 304 on the bottom of the substrate layer 314 is electrically connected to (not shown). Alternatively, as shown in FIG. 4AA' the contact opening 540''' to the well region 306 at the bottom of the down-bond contact trench 318a may be etched through well region 306 into the substrate layer 314 so that the tungsten plug 342' penetrates into and makes contact with the well region 306 and the substrate layer 314 which acts as the source for the ACCUFET 330' thereby providing a connection for the anode of diode shorted to the source of the ACCUFET.

Aspects of the present disclosure allow for a compact and efficient bi-directional switch design that makes efficient use of the available chip area for active device formation and that can be manufactured without requiring back-grinding or, in some implementations, without having to form back metal.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A method for forming a bi-directional semiconductor switching device, comprising:
    forming first and second vertical field effect transistors (FETs) in tandem from a semiconductor substrate, wherein a source for the first FET is on a first side of the substrate and a source for the second FET is on a second side of the substrate opposite the first side, wherein gates for both the first and second FETs are disposed in tandem in a common set of trenches formed in a drift region of the semiconductor substrate that is sandwiched between the source for the first FET and the source for the second FET, wherein the drift region forms a common drain for both the first FET and the second FET wherein the drift region is of a same conductivity type as the source for the first FET and the source for the second FET but at a lower carrier concentration than that of the source for the first FET and the source for the second FET.

2. The method of claim 1, wherein forming the first and second FETs comprises forming a set of trenches from the first side of the substrate into the drift region; implanting dopants of the same conductivity type as a substrate layer into bottoms of at least some of the trenches in the set;
    forming a gate insulator on sidewalls and bottoms of the at least some of the trenches in the set;
    forming gate electrodes for the second FET in lower portions of the trenches;
    forming inter-gate dielectric over the gate electrodes for the second FET;
    forming gate electrodes for the first FET in upper portions of the trenches above the inter-gate dielectric, wherein the gate electrodes of the first FET are electrically isolated from the sidewalls of the at least some of the trenches.

3. The method of claim 2, wherein the first FET is a metal oxide semiconductor FET (MOSFET).

4. The method of claim 3, further comprising implanting body dopants of a conductivity type opposite a conductivity type of the drift region into upper portions of the drift region proximate the gate electrodes for the first FET and diffusing the dopants to form a body region for the MOSFET.

5. The method of claim 4, further comprising implanting source dopants of a same conductivity type as the drift region into upper portions of the drift region proximate the gate electrodes for the MOSFET and diffusing the source dopants to form source region for the MOSFET, wherein the body region for the MOSFET is between the source region for the MOSFET and the drift region.

6. The method of claim 3, wherein the first FET is a first MOSFET and the second FET is a second MOSFET, wherein the substrate includes a substrate layer of a first conductivity type and a doped layer of a second conductivity type sandwiched between the drift region and the substrate layer, wherein the second conductivity type is opposite the first conductivity type, wherein the doped layer of the second conductivity type forms a body region for the second MOSFET, wherein the drift region is of a lesser doping concentration than the substrate layer.

7. The method of claim 6, wherein forming the set of trenches includes forming the set of trenches to a depth sufficient for the trenches to penetrate into the body region for the second MOSFET but not into the substrate layer, the method further comprising implanting source dopants of the first conductivity type into portions of the body region for the second MOSFET at bottoms of the trenches before forming the gate electrodes and diffusing the source dopants to form source regions for the second MOSFET, wherein the source regions for the second MOSFET merge with the substrate layer.

8. The method of claim 3, wherein the second FET is an accumulation mode FET (ACCUFET), wherein the substrate includes a substrate layer of a first conductivity type and the drift region is formed on the substrate layer, wherein the drift region is of the first conductivity type but of a lesser doping concentration than a doping concentration of the substrate layer.

9. The method of claim 8, further comprising implanting counter dopants of the second conductivity type into portions of the drift region at bottoms of the trenches before forming the gate electrodes in the at least some of the trenches and diffusing the counter dopants to form well regions.

* * * * *